(12) United States Patent
Lee

(10) Patent No.: US 7,317,413 B2
(45) Date of Patent: Jan. 8, 2008

(54) MULTI-CHANNEL DIGITAL TO ANALOG (D/A) CONVERSION

(76) Inventor: Ying Lau Lee, 32/F., Siu on Centre, 188 Lockhart Road, Wanchai, Hong Kong (CN)

( * ) Notice: Subject to any disclaimer, the term of this patent is extended or adjusted under 35 U.S.C. 154(b) by 0 days.

(21) Appl. No.: 11/437,289

(22) Filed: May 19, 2006

(65) Prior Publication Data

US 2006/0290550 A1 Dec. 28, 2006

Related U.S. Application Data

(60) Provisional application No. 60/741,066, filed on Dec. 1, 2005, provisional application No. 60/700,724, filed on Jul. 20, 2005, provisional application No. 60/693,071, filed on Jun. 23, 2005.

(51) Int. Cl.
*H03M 1/66* (2006.01)

(52) U.S. Cl. ........................ 341/144; 341/141

(58) Field of Classification Search ............... 341/141, 341/122, 123, 144, 145
See application file for complete search history.

(56) References Cited

U.S. PATENT DOCUMENTS

| 5,870,047 A * | 2/1999 | Piesinger ..................... 341/143 |
| 6,452,526 B2 * | 9/2002 | Sagawa et al. ............. 341/144 |
| 6,531,975 B1 * | 3/2003 | Trotter et al. ............... 341/144 |
| 6,771,198 B2 | 8/2004 | Azadet ........................ 341/110 |
| 2002/0063649 A1 * | 5/2002 | Viswanathan ............... 341/147 |
| 2004/0189502 A1 | 9/2004 | Lee ............................. 341/148 |
| 2005/0062526 A1 | 3/2005 | Morris et al. ................. 330/10 |
| 2005/0231410 A1 | 10/2005 | Lee ............................. 341/144 |

FOREIGN PATENT DOCUMENTS

| JP | 58087916 | 5/1983 |
| JP | 10-322212 | 12/1998 |

* cited by examiner

*Primary Examiner*—Brian Young
(74) *Attorney, Agent, or Firm*—Weingarten, Schurgin, Gagnebin & Lebovici LLP

(57) ABSTRACT

A multi-channel digital-to-analog (D/A) conversion system that can produce an analog output (210) from a digital signal (201) using N D/A converters (C1-CN), each with 1/N of the resolution of a single D/A converter used to perform the same D/A conversion. A data sample (Din) of the digital signal (201) is decomposed into N data sub-samples (D1-DN). The sum of the values of the data sub-samples (D1-DN) is equal to the value of the data sample (Din), while the normalized range of the value of the data sample Din is greater than the normalized range of the value of each data sub-sample (D1-DN). Each D/A converter (C1-CN) receives a respective one of the data sub-samples (D1-DN), and generates a respective one of a plurality of analog component outputs (A1-AN) singly or jointly with at least one of the other D/A converters (C1-CN). The analog output (210) is produced by additively combining the plurality of analog component outputs (A1-AN).

81 Claims, 9 Drawing Sheets

MULTI-CHANNEL DIGITAL TO ANALOG (D/A) CONVERSION

CROSS REFERENCE TO RELATED APPLICATIONS

This application claims benefit of U.S. Provisional Patent Application No. 60/693,071 filed Jun. 23, 2005 entitled MULTI-CHANNEL PULSE WIDTH MODULATION IN DIGITAL SYSTEM, U.S. Provisional Patent Application No. 60/700,724 filed Jul. 20, 2005 entitled MULTI-CHANNEL DIGITAL TO ANALOG (D/A) CONVERSION, and U.S. Provisional Patent Application No. 60/741,066 filed Dec. 1, 2005 entitled MULTI-CHANNEL DIGITAL TO ANALOG (D/A) CONVERSION.

STATEMENT REGARDING FEDERALLY SPONSORED RESEARCH OR DEVELOPMENT

N/A

BACKGROUND OF THE INVENTION

The present invention relates generally to digital-to-analog (D/A) conversion systems and methods for generating an analog output from a digital signal, and more specifically to digital audio systems for generating an audio output from a digital signal. The present invention also relates to D/A conversion systems, in which the analog output can take the form of an electrical, acoustic, electromagnetic, thermal, liquid, gaseous, mechanical, or any other suitable type of analog output.

Audio source information has traditionally been accessed as analog signals and recorded in analog form, for example, on magnetic tape or phonograph records. There are two basic types of amplifiers that may be employed in the processing of analog signals. One type of amplifier is the conventional analog amplifier, which can be implemented in different topologies and classes depending upon how much current is allowed to flow through the amplifier's output transistors or tubes in the quiescent state, e.g., when the transistors or tubes are not delivering power to loudspeakers in an audio system. Such conventional analog amplifiers include the class A amplifier, the class B amplifier, etc. Another type of amplifier is the conventional switching type amplifier such as the class D amplifier, which has been employed for many years in various high efficiency industrial and medical applications. Like the class A and class B amplifiers, the class D amplifier may be implemented using transistors or tubes. However, instead of producing amplified analog signals that can have many different values, the class D amplifier switches between two voltage levels to produce a binary-level pulse width modulation (PWM) electrical output signal. As a result, at any given time, the output transistors or tubes of the class D amplifier are either "on" or "off". In a typical audio application, the binary-level PWM output of the class D amplifier is low-pass filtered to suppress rapid changes in the output waveform, and the average value of the PWM output is employed to drive loudspeakers of an audio system.

Since the advent of the digital age, most audio source information has been accessed as digital signals and recorded in digital form using, e.g., CD or MP3 digital formats, and therefore a D/A conversion of an input signal in digital form to an output signal in analog form is generally required to enable the input signal to be amplified by conventional amplifiers driving loudspeakers of an audio system. More recently, there has been increased interest in developing audio systems that do not require the D/A conversion circuitry typically included in conventional audio systems. One such typical audio system is discussed in co-pending U.S. patent application Ser. No. 10/819,573 filed Apr. 7, 2004 entitled MULTI-LEVEL PULSE WIDTH MODULATION IN DIGITAL SYSTEM (the '573 application) by the same inventor as the present invention, which describes a typical PWM-based digital audio system that includes an interpolator stage, a noise shaper stage, a PWM converter stage, and a switching output stage. Like the conventional analog-input class D amplifier, the switching output stage of the system described in the '573 application produces a PWM output, which is typically filtered by a low-pass filter and used to drive one or more loudspeakers of an audio system.

Although the audio system described in the '573 application has been successfully employed for generating an audio output signal from a digital signal, the system has drawbacks in that the resolution of the system is limited by the switching speed of the power output switching transistors included in the switching output stage. To reduce the switching speed requirement of the switching output stage, a D/A conversion technique may be employed that uses a "coarse" signal and a "fine" signal to represent the digital signal. In this kind of D/A conversion technique, one unit of the coarse signal is equivalent to a fixed number of units of the fine signal. In other words, each unit of the coarse signal carries more weight than one unit of the fine signal. The coarse and fine signals are converted independently to some form of intermediate electrical signals, and then electrically combined with different weightings to produce the electrical output signal of the D/A conversion. Because the maximum number of units possible for the coarse and fine signals are both smaller than the maximum number of units possible for the digital signal, the resolution requirements for the D/A conversion of the coarse and fine signals to their respective intermediate electrical signals are lower than the resolution requirement for the direct D/A conversion of the digital signal.

Japan Patent No. 58087916 entitled DIGITAL-TO-ANALOG CONVERTER (the '916 patent) discloses a D/A converter that employs a D/A conversion technique that uses coarse and fine signals with different weightings to represent a digital signal. Specifically, the '916 patent discloses a technique that employs PWM signals having different amplitudes. The coarse signal comprises the most significant bits (MSBs) of the digital signal, and corresponds to a PWM signal having a larger amplitude to account for the higher weighting of the coarse signal. The fine signal comprises the least significant bits (LSBs) of the digital signal, and corresponds to a PWM signal having a smaller amplitude to account for the lower weighting of the fine signal. The two PWM signals having different amplitudes are combined electrically via a low-pass filter to produce the electrical output signal of the D/A conversion.

The system disclosed in the '573 application also employs coarse and fine signals like the D/A converter disclosed in the '916 patent, but in a significantly different way. Specifically, the system of the '573 application employs a D/A conversion technique to generate a multi-level PWM signal (i.e., PAM (pulse amplitude modulation)+PWM), from which the electrical output signal of the D/A conversion is produced. As disclosed in the '573 application, a coarse signal comprises the MSBs of a digital signal and corresponds to the multi-level component (i.e., the PAM component) of the multi-level PWM signal. Further, a fine signal comprises the LSBs of the digital signal and corresponds to the PWM component of the multi-level PWM signal. The PAM component is a multi-level fixed-pulse-width signal, while the PWM component is a single-level PWM signal. The multi-level PWM signal is formed by combining the single-level PWM signal with the multi-level fixed-pulse-width signal. The width of the multi-level PWM signal is equal to the width of the PAM component, which is equal to the maximum width of the PWM component plus one unit width. Each amplitude level of the PAM component is a multiple of the amplitude of the PWM component. Each amplitude level of the PAM component represents a value of the coarse signal and reflects the fact that the coarse signal carries more weight than the fine signal. The system disclosed in the '573 application includes switching circuitry for generating the multi-level PWM signal, which is filtered by a low-pass filter to produce the electrical output signal of the D/A conversion.

The '573 application discloses additional embodiments which enhance the multi-level PWM technique disclosed therein. For example, in one embodiment, the resolution requirement for resolving the coarse signal is reduced by having each one of a multiplicity of channels resolve a portion of the coarse signal at the same time instead of having a single channel resolve the entire coarse signal. The outputs of the multiple channels are additively combined to produce the equivalent output produced by a corresponding single channel system.

The '573 application also discloses a multi-channel digital audio system, in which an audio output signal is generated from a digital signal. A data sample of the digital signal is represented by a plurality of signal groups comprising a PWM signal corresponding to the LSBs of the digital signal (the fine signal) and multiple sets of control signals corresponding to the MSBs of the digital signal (the coarse signal). Each of the plurality of signal groups represents a partial value of the data sample of the digital signal. The sum of these partial values of the data sample is equal to the value of the data sample. In the multi-channel digital audio system of the '573 application, each signal group controls a corresponding switching output stage, in which each switching output stage is associated with a corresponding one of a plurality of channels. The signal group that controls the switching output stage of a fixed one of the plurality of channels comprises the PWM signal corresponding to the fine signal and one of the sets of control signals corresponding to a portion of the coarse signal. The switching output stages in the remaining channels are controlled by the remaining sets of control signals corresponding to the remaining portions of the coarse signal. Each signal group therefore controls a respective switching output stage of a respective channel to produce a respective electrical signal, which is filtered by a respective low-pass filter before being provided to a respective loudspeaker to produce a respective audio component signal. The electrical signal generated by a respective switching output stage can be an ordinary PWM signal, a PAM signal, or a multi-level PWM (i.e., PAM+PWM) signal. The respective audio component signals are then additively combined in the transmission medium, e.g., the air, to produce the audio output signal.

As described above, the '573 application discloses a digital system that employs a D/A conversion technique that uses coarse and fine signals to represent a digital signal, in which the fine signal is processed by a fixed one of multiple channels, and a portion of the coarse signal is processed by each of the multiple channels. Further, the system includes a plurality of switching output stages, in which each switching output stage is associated with a corresponding one of the plurality of channels. Because a respective portion of the coarse signal is processed by each switching output stage, it is possible to have a lower resolution requirement for each switching output stage to resolve the respective portion of the coarse signal than the resolution requirement needed by a single switching output stage for resolving the complete coarse signal. In other words, it is possible to have a smaller number of different voltage levels for the digital system because each switching output stage requires fewer voltage levels to represent a respective portion of the coarse signal, and the set of voltage levels associated with each switching output stage can be identical. Therefore, the number of different voltage levels minus one for the digital system as compared to the number of different voltage levels minus one for a corresponding single channel digital system can be reduced by a factor equal to the number of switching output stages.

It should be noted that the term "channel" is used herein in a generic sense, and is independent of other channelization that may occur in a digital audio system, such as traditional stereo channels, or surround sound channels, e.g., the left, center, right, rear left, rear right, etc., audio channels of a multi-channel audio system that accepts multi-channel digital signals as input, from which a respective digital signal is obtained as input for each respective audio channel of the system, in which each respective digital signal contains information independent of the other digital signals. In such a multi-channel audio system, each audio channel may contain multiple associated channels as explained above, and the audio output of a respective one of the audio channels may be produced by additively combining the audio component signals provided by the multiple channels associated therewith. Each of the audio channels produces information that is independent of the other audio channels, while each of the channels associated with a respective one of the audio channels provides a portion of the information produced by the respective audio channel.

One drawback of the above-described D/A conversion techniques that use coarse and fine signals with different weightings to represent a digital signal is that the coarse and fine signals must generally be converted with a high level of accuracy because any error in the signal conversion is magnified by the corresponding weight of the signal. For example, if a 16-bit data sample of the digital signal is divided into a fine signal comprising the 8 LSBs having a value of 100 and a coarse signal comprising the 8 MSBs having a value of 100, then the coarse signal weighs 256 times the fine signal. An error of, e.g., about 0.01% in the conversion of the coarse signal is therefore equivalent to a value of about 2.56% of the fine signal.

Another drawback of the above-described D/A conversion techniques result from the different responses to the coarse and fine signals that can be produced by the digital system. Specifically, when the digital signal varies from a value slightly less than a specified unit of the coarse signal to a value slightly greater than the specified value of the coarse signal, or vice versa, the coarse signal can increase by one unit while the fine signal changes from a maximum value to a minimum value, or vice versa. In an ideal system, such changes in the coarse and fine signals can offset each other and produce the desired analog output. However, due to the different responses to the coarse and fine signals produced by practical systems, such a slight variation in the value of the digital signal can cause unwanted transient outputs. This is particularly problematic for multi-channel systems like the one described in the '573 application because the fine signal is processed by a fixed one of multiple channels, while the coarse signal is processed by all of the channels. As a result, it is generally difficult to match or compensate the response of the fixed channel for the fine signal and the responses of all of the channels for the coarse signal to avoid occurrences of transient outputs, especially if the analog output is a non-electrical output.

One way of solving this problem of multi-channel systems is disclosed in co-pending U.S. patent application Ser. No. 11/103,952 filed Apr. 12, 2005 entitled SCHEMES TO IMPLEMENT MULTI-LEVEL PWM IN DIGITAL SYSTEM (the '952 application) by the same inventor as the present invention. As disclosed in the '952 application, a D/A conversion system has multiple channels, in which each channel can produce either a multi-level PWM signal like the system described in the '573 application, or two PWM signals like the system described in the '916 patent. The fine signal is processed by all of the channels in the system according to the value of the coarse signal, instead of being processed by a fixed one of the channels. Because the fine signal is processed by all of the channels, the system of the '952 application can achieve smoother transitions in the outputs of the various channels in response to variations of the digital signal, thereby reducing the occurrence of unwanted transients in the analog output. However, the D/A conversion technique disclosed in the '952 application is limited in that it is primarily for use in PWM-based systems.

It would therefore be desirable to have an improved D/A conversion system and method that can produce an analog output from a digital signal using D/A converters with lower resolution. Such a D/A conversion system would be implementable as a PWM-based system, a sigma delta D/A conversion system, or any other suitable type of D/A conversion system, while avoiding the drawbacks of the above-described conventional D/A conversion systems and techniques.

BRIEF SUMMARY OF THE INVENTION

In accordance with the present invention, a multi-channel digital-to-analog (D/A) conversion system and method is disclosed that can produce an analog output from a digital signal using D/A converters with lower resolution. The presently disclosed multi-channel D/A conversion system achieves the resolution of the digital signal by using D/A converters that have a resolution that is less than the resolution of the digital signal. Each of the D/A converters employed in the presently disclosed system can be of any suitable type, and can be based on different operating principles such as PWM, sigma-delta, etc. Further, the analog output produced by the presently disclosed system can be an electrical, acoustic, electromagnetic, thermal, liquid, gaseous, mechanical, or any other suitable type of analog output.

In practice, any D/A converter with a given maximum output level has a certain limit in the resolution of its output. The limitation in the resolution of the D/A converter output may be due to a number of factors such as the limitation in the switching speed of associated switching amplifiers, the noise of associated analog amplifiers, the friction and mechanical imperfections of associated loudspeakers, etc. As a result, a typical D/A converter generally cannot consistently produce the same corresponding change in its output when a corresponding change in the value of a digital signal at its input is smaller than a certain limiting value. Although there are D/A converters that can produce low power electrical output signals with very high resolution even at very high conversion speed, it is generally difficult to make D/A converters to produce high resolution non-electrical analog outputs or high power electrical output signals, at high conversion speed.

For example, a typical digital audio system including an amplifier and a loudspeaker effectively operates as a D/A converter, which converts a digital signal into an analog output corresponding to an audio output. The resolution of the audio system therefore depends on the resolution of both the amplifier and the loudspeaker, which may have lower resolution than the amplifier. The presently disclosed multi-channel D/A conversion system provides a multi-channel D/A conversion technique for producing an analog output from a digital signal using D/A converters with resolutions lower than the resolution required for a single D/A converter acting alone to perform the same D/A conversion.

In one mode of operation, a data sample of a digital signal is decomposed into a set of N data sub-samples with shorter word lengths or smaller maximum absolute values than the data sample such that the sum of the values of the set of N data sub-samples is equal to the value of the data sample of the digital signal, i.e., $$D_{in} = \sum_{n=1}^{N} D_n,$$

in which "Din" represents the data sample of the digital signal, and "Dn" represents the nth data sub-sample of the data sample Din. The analog output corresponding to the digital signal is produced by additively combining a plurality of analog component outputs, each of which is produced by a respective one of a plurality of D/A converters or channels from a respective one of the set of data sub-samples. In this mode of operation, the resolution requirement for each of the plurality of D/A converters is reduced because each D/A converter resolves a partial value of the data sample of the digital signal instead of resolving the entire data sample, which has a larger maximum absolute value.

In one embodiment, the disclosed multi-channel D/A conversion system includes a data decomposer operative to decompose the data sample of a digital signal into a set of data sub-samples such that the sum of the values of the set of data sub-samples is equal to the value of the data sample of the digital signal, and each data sub-sample differs from each of the other sub-samples by a small value. The analog output corresponding to the digital signal is produced by additively combining a plurality of analog component outputs, each of which is produced by a respective one of a plurality of D/A converters or channels from a respective one of the set of data sub-samples. The small difference in the value of each data sub-sample allows smooth transitions in the outputs of the plurality of D/A converters or channels and even distribution of power among the plurality of D/A converters or channels in response to variations of the digital signal.

In another embodiment, the disclosed multi-channel D/A conversion system comprises a data decomposer including a pre-decomposing processor, a decomposing processor, and a post-decomposing processor. The pre-decomposing processor is operative to process a digital input signal to produce a digital signal, which has its data sample decomposed into a set of data sub-samples by the decomposing processor. The post-decomposing processor is operative to adjust the value of each of the set of data sub-samples individually, in accordance with a suitable model of the characteristics of its respective D/A converter, to compensate for the non-linear response of its respective D/A converter and/or to perform any other processing necessary to produce the desired outputs, e.g., mapping the data sub-samples one-to-one to the inputs of the D/A converters according to the value of the digital signal being decomposed.

A data sample of a digital signal representing an analog value can be in a signed or unsigned format, having a value between a minimum value and a maximum value. For example, when a digital audio signal is in an unsigned format, its data sample typically has a minimum value equal to zero. However, when a digital audio signal is in a signed format, the minimum and maximum values of its data sample are typically equal in magnitude but opposite in sign. The range of the analog value corresponds to the range of the value of the data sample of the digital signal, which is equal to the difference between the maximum and minimum values of the data sample of the digital signal. When a fixed offset value is added to the value of the data sample of the digital signal, the range of the value of the data sample of the digital signal does not change. It is therefore possible to convert a digital signal from a signed format to an unsigned format by adding a fixed offset value to the value of its data sample or vice versa.

In the illustrative mode of operation described above, a data sample of a digital signal is decomposed into a set of N data sub-samples with shorter word lengths or smaller maximum absolute values than the data sample. This mode of operation is applicable to the case in which the data sample of the digital signal and its data sub-samples are all in the same unsigned format with the respective minimum values equal to zero, or all in the same signed format with the respective minimum and maximum values equal in magnitude but opposite in sign.

Generally, for other modes of operation, the range of the value of each data sub-sample is required to be smaller than the range of the value of its corresponding data sample when the minimum incremental value of each data sub-sample is equal to the minimum incremental value of its corresponding data sample. The minimum incremental value of a data sample or data sub-sample is equal to the highest common factor of the possible values of the data sample or data sub-sample, respectively, which means that any value of the data sample or data sub-sample is equal to a multiple of its respective minimum incremental value. However, in some embodiments, the data decomposer, specifically, the post-decomposing processor, is operative to multiply the value of each of the data sub-samples by a respective scaling factor before providing the data sub-sample to the D/A converter associated with the respective data sub-sample for subsequent conversion.

For example, a digital audio system with 16-bit resolution may include four digital audio amplifiers, each with 14-bit actual resolution, but require its input digital signal to be in a 16-bit standard format. This means that only 14 consecutive bits out of a 16-bit data sample of the input digital signal are relevant to the digital audio amplifiers. Assume, in this example, that the most significant 14 bits of a 16-bit input digital signal are relevant to the digital audio amplifiers. Within such a system, the data decomposer can be configured to decompose a 16-bit value data sample of the input digital signal into four 14-bit value data sub-samples, assuming that the data sample is in an unsigned format and its value does not exceed ($2^{16}$−4). In order to make full use of the 14-bit resolution of the digital audio amplifiers, the post-decomposing processor multiplies the values of the data sub-samples by a scaling factor of 4. Next, the post-decomposing processor provides the four 16-bit value data sub-samples, each with 14-bit resolution, to the four digital audio amplifiers, respectively, each of which produces a respective audio component signal. The audio component signals are then additively combined in the transmission medium to produce the final 16-bit resolution audio output of the digital audio system.

It is noted that when the range of the value of the data sample is greater than the range of the value of each of its data sub-samples and the minimum incremental value of the data sample is equal to the minimum incremental value of each of its data sub-samples, the normalized range of the value of the data sample is greater than the normalized range of the value of each of its data sub-samples. The normalized range of the value of a data sample or data sub-sample is equal to the range of the value of the data sample or data sub-sample, respectively, divided by its respective minimum incremental value. Furthermore, although the range of the value and the minimum incremental value of each of the data sub-samples may change when the value of the respective data sub-sample is multiplied by a respective scaling factor, the normalized range of the value of each of the data sub-samples remains unchanged. Similarly, the normalized range of the value of the data sample is unchanged when the value of the data sample is multiplied by a predetermined number. Thus, in general, the data decomposer is operative to decompose a data sample of a digital signal into a set of N data sub-samples such that the normalized range of the value of the data sample is greater than the normalized range of the value of each of its data sub-samples.

It is noted that in the presently disclosed multi-channel D/A conversion system, the pre-decomposing processor can be configured to handle the format conversion of its corresponding data sample by adding a fixed offset value to the value of the data sample. In addition, the post-decomposing processor can be configured to handle the format conversion of its respective data sub-samples by adding a respective offset value to the value of a respective one of its set of data sub-samples.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

The disclosures of U.S. Provisional Patent Application No. 60/693,071 filed Jun. 23, 2005 entitled MULTI-CHANNEL PULSE WIDTH MODULATION IN DIGITAL SYSTEM, U.S. Provisional Patent Application No. 60/700,724 filed Jul. 20, 2005 entitled MULTI-CHANNEL DIGITAL TO ANALOG (D/A) CONVERSION, and U.S., Provisional Patent Application No. 60/741,066 filed Dec. 1, 2005 entitled MULTI-CHANNEL DIGITAL TO ANALOG (D/A) CONVERSION are incorporated herein by reference in their entirety.

A multi-channel digital-to-analog (D/A) conversion system and method is disclosed that can produce an analog output from a digital signal with better resolution and dynamic range than conventional single channel D/A conversion systems. The presently disclosed multi-channel D/A conversion system can achieve the resolution of the digital signal using D/A converters that have a resolution that is less than the resolution of the digital signal. In one mode of operation, the disclosed multi-channel D/A conversion system decomposes a data sample of a digital signal into a set of data sub-samples, in which the difference between the maximum and minimum values of each data sub-sample is smaller than the difference between the maximum and minimum values of the data sample, i.e., the range of the value of each data sub-sample is smaller than the range of the value of the data sample; the minimum incremental value of each data sub-sample is equal to the minimum incremental value of the data sample; and, the sum of the values of the set of data sub-samples is substantially equal to the value of the data sample of the digital signal. Next, the analog output corresponding to the digital signal is produced by additively combining a plurality of analog component outputs, each of which is produced by a respective one of a plurality of D/A converters or channels from a respective one of the set of data sub-samples. In this mode of operation, the resolution requirement for each of the plurality of D/A converters is reduced because each D/A converter resolves a respective data sub-sample of the data sample of the digital signal instead of resolving the entire data sample, which has a greater number of different possible values than each of its data sub-samples.

Figure 1:
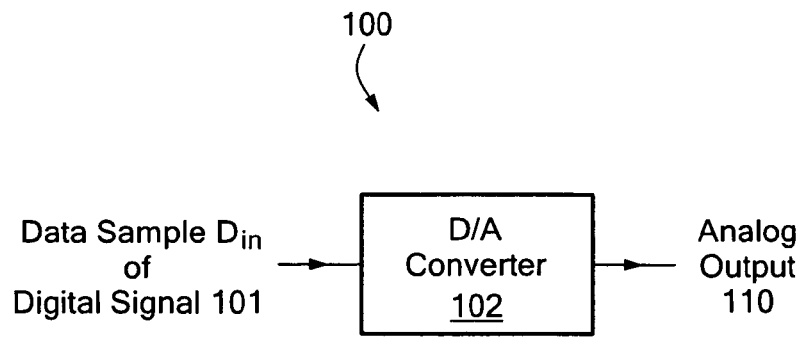
FIG. 1 is a block diagram of a conventional D/A conversion system for producing an analog output from a digital signal.

FIG. 1 depicts a conventional D/A conversion system 100 including a digital-to-analog (D/A) converter 102 operative to convert a data sample Din of a digital signal 101 into an analog output 110 with its corresponding quantifying attribute proportional to the value of the data sample Din. The analog output is to be interpreted herein in a broad sense to include not only electrical output signals, but also physical outputs, e.g., sounds or any other suitable type of analog output that can be additively combined together in a transmission or carrying medium such as the air or in any other suitable way to produce a final analog output.

Figure 2:
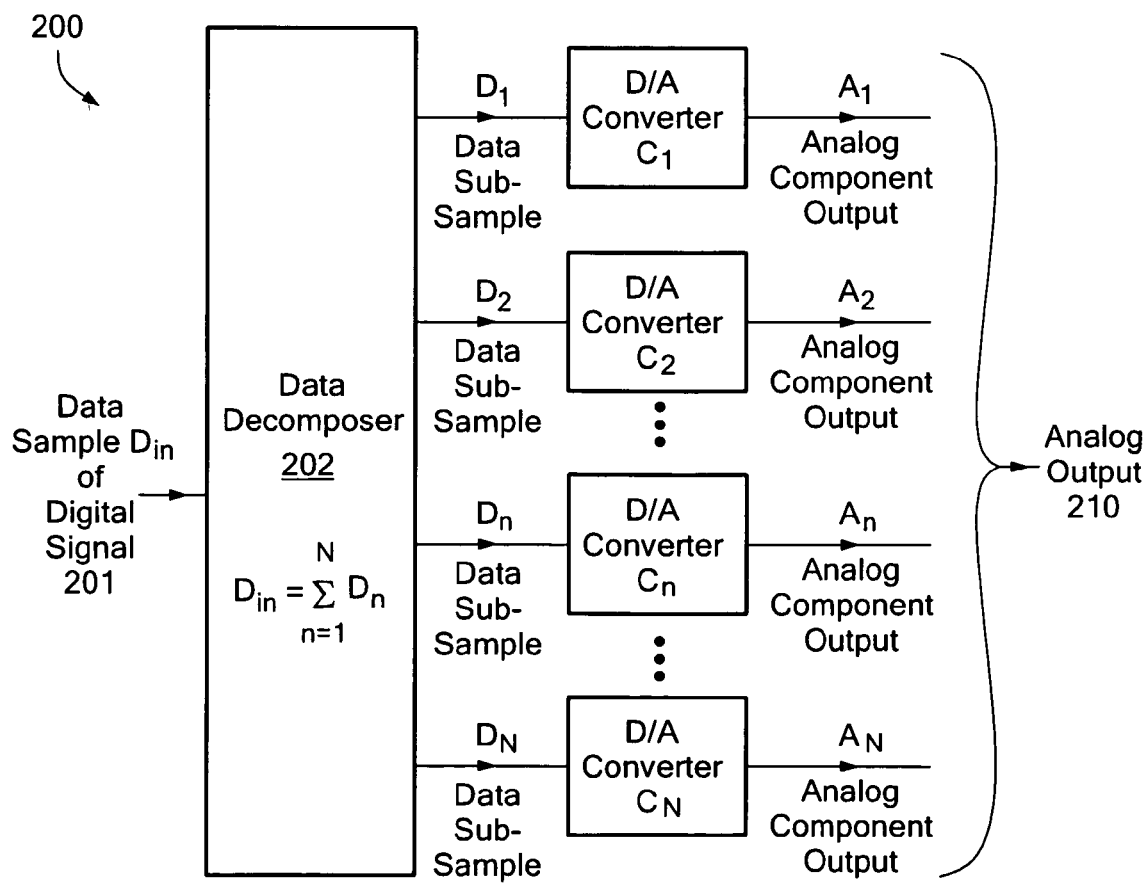
FIG. 2 is a block diagram of a multi-channel D/A conversion system for producing an analog output from a digital signal according to the present invention.

FIG. 2 depicts an illustrative embodiment of a multi-channel D/A conversion system 200, in accordance with the present invention. In the illustrated embodiment, the multi-channel D/A conversion system 200 includes a data decomposer 202 and a plurality of N D/A converters C1-CN. The data decomposer 202 decomposes a data sample Din of a digital signal 201 into a set of N data sub-samples D1-DN, in which the normalized range of the value of the data sample Din is greater than the normalized range of the value of each of its data sub-samples D1-DN. The sum of the values of the set of N data sub-samples D1-DN is equal to the value of the data sample Din, i.e., $$D_{in} = \sum_{n=1}^{N} D_n, \tag{1}$$

in which "Din" is the data sample of the digital signal 201, and "Dn" represents the nth data sub-sample of the data sample Din. Each one of the plurality of N D/A converters C1-CN converts a respective one of the set of N data sub-samples D1-DN into a respective one of a plurality of N analog component outputs A1-AN, which are additively combined to produce the final analog output 210. It can be seen that when the digital signal 201 of FIG. 2 is the same as the digital signal 101 of FIG. 1, the analog output 210 of FIG. 2 is substantially the same as the analog output 110 of FIG. 1. However, the resolution requirement for each of the plurality of D/A converters C1-CN is reduced because each of the plurality of D/A converters C1-CN resolves a respective one of the set of data sub-samples D1-DN of the data sample Din of the digital signal 201 instead of resolving the entire data sample Din, which has a greater number of different possible values than each of the data sub-samples D1-DN. When employing N D/A converters C1-CN for the D/A conversion of the digital signal 201, the resolution requirement for each of the D/A converters C1-CN can be reduced to at most 1/N of the required resolution for a single D/A converter acting alone to perform the same D/A conversion of the digital signal 201.

In FIG. 2, the data decomposer 202 decomposes the data sample Din of the digital signal 201 into a set of N data sub-samples D1-DN such that the value of each of the set of data sub-samples D1-DN differs in value from each of the other data sub-samples by at most an absolute amount of L at any given time, in which L is a positive number, and the sum of the values of the set of data sub-samples D1-DN is equal to the value of the data sample Din according to equation (1) above. The small difference L in the values of the data sub-samples D1-DN assures even distribution of the digital signal 201 among the plurality of N D/A converters C1-CN or channels in response to variations of the digital signal 201, and therefore allows smooth transitions in the outputs of the plurality of D/A converters C1-CN or channels and even distribution of power among the plurality of D/A converters C1-CN or channels.

In the presently disclosed embodiment, the data decomposer 202 (see FIG. 2) operates as follows. The data sample Din of the digital signal 201 is divided by the value L to provide a quotient J and remainder K, which has one of the absolute values 0, 1, 2, ..., L−1. J is further divided by the number of data sub-samples N to yield a quotient Y and remainder Z, which has one of the absolute values 0, 1, 2, ..., N−1. The data sub-sample Dn, which is the nth data sub-sample of the set of N data sub-samples, n being an integer and having a value from 1 to N, has the following values:

$$Dn = Y*L \text{ if } |Z|<n-1;$$

$$Dn = (Y*L+K) \text{ if } |Z|=n-1;$$

$$Dn = (Y+1)*L \text{ if } |Z|>n-1 \text{ and } Z>0; \text{ or}$$

$$Dn = (Y-1)*L \text{ if } |Z|>n-1 \text{ and } Z<0. \quad (2)$$

For example, if N=4 and Z=1, then $$D1 = (Y+1)*L;$$

$$D2 = (Y*L+K);$$

$$D3 = Y*L; \text{ and}$$

$$D4 = Y*L. \quad (3)$$

For the special case in which L=1, the value of the data sample Din of the digital signal 201 is equal to J, while K is equal to zero. Therefore, the value of the data sub-sample Dn has the following values:

$$Dn = Y \text{ if } |Z|<n-1;$$

$$Dn = Y \text{ if } |Z|=n-1;$$

$$Dn = Y+1 \text{ if } |Z|>n-1 \text{ and } Z>0; \text{ or}$$

$$Dn = Y-1 \text{ if } |Z|>n-1 \text{ and } Z<0, \quad (4)$$

in which "Y" and "Z" are the quotient and remainder, respectively, of the division of Din by N. For example, if N=4 and Z=1, then $$D1 = Y+1;$$

$$D2 = Y;$$

$$D3 = Y; \text{ and}$$

$$D4 = Y. \quad (5)$$

Although L=1 assures the most even distribution of the digital signal 201 among the plurality of N D/A converters C1-CN, this may not be desirable when the absolute value of the data sample Din of the digital signal 201 is very small, especially when N is large. This is because the value of the data sample Din may be spread out too thin among the plurality of N D/A converters C1-CN for the system of FIG. 2 to operate effectively. Therefore, it may be better to have L>1 when the absolute value of the data sample Din is smaller than a predetermined value, and to have L=1 when the absolute value of the data sample Din is equal to or greater than the predetermined value. The changing of the value of L can be done seamlessly for the system of FIG. 2 at anytime when all of the values of the data sub-samples D1-DN are equal to each other. Alternatively, fewer D/A converters may be employed when the absolute value of the data sample Din is small, and a greater number of D/A converters may be employed when the absolute value of the data sample Din is increased.

Figure 3:
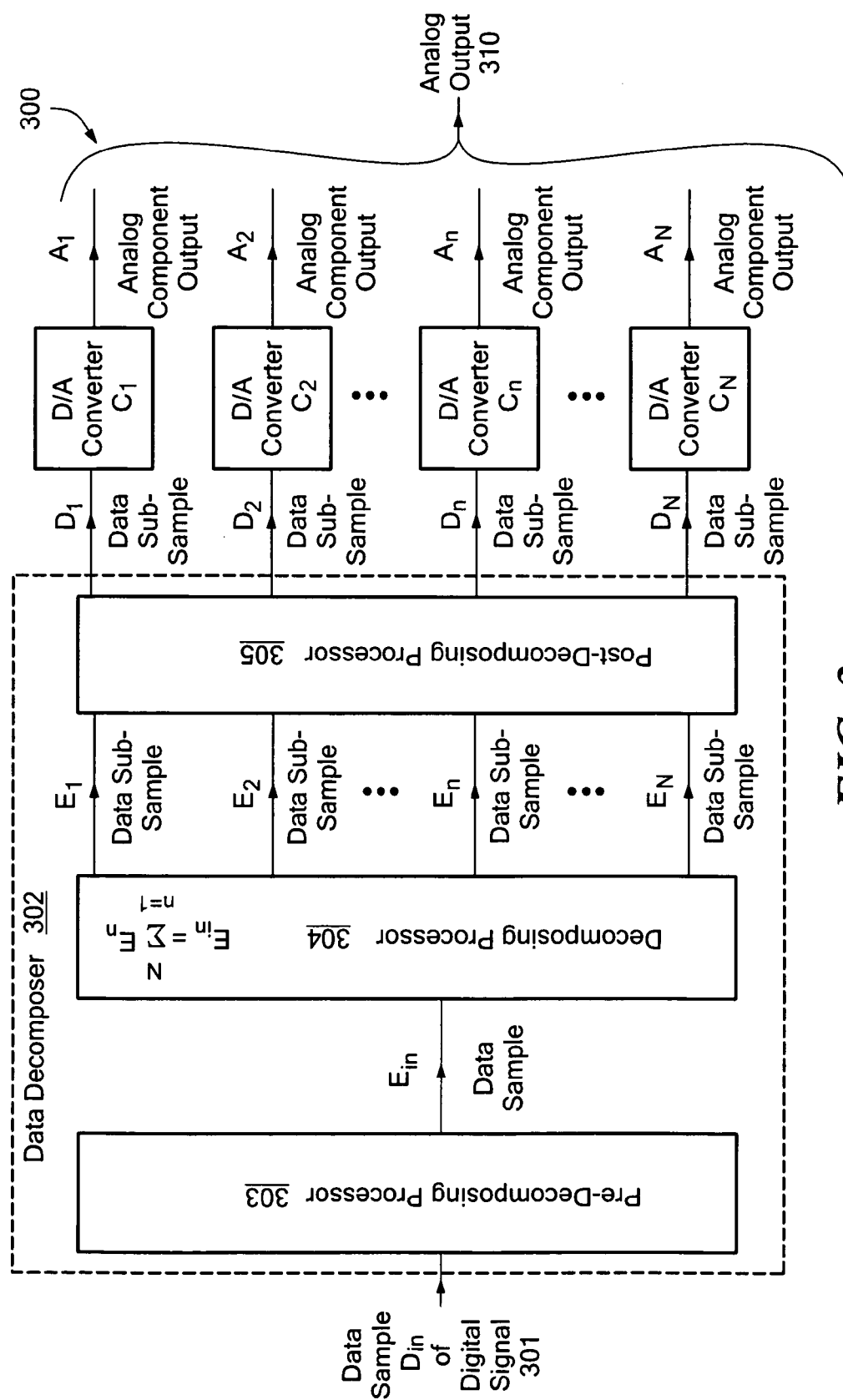
FIG. 3 is a block diagram of a multi-channel D/A conversion system, showing a detailed structure of a data decomposer included therein according to the present invention.

It should be noted that there are many ways to decompose the data sample Din of the digital signal 201, and in some cases, the sum of the values of the set of data sub-samples D1-DN may not be equal to the value of the data sample Din. FIG. 3 illustrates an embodiment of a data decomposer 302 that may produce the aforesaid inequality result.

FIG. 3 depicts a multi-channel D/A conversion system 300, showing a detailed structure of the data decomposer 302. As shown in FIG. 3, the data decomposer 302 includes a pre-decomposing processor 303, a decomposing processor 304, and a post-decomposing processor 305. The pre-decomposing processor 303 is operative to process the data sample Din of the digital signal 301 to produce a data sample Ein. For example, the data sample Din may have a fixed number of its MSBs extracted, and/or be multiplied by a factor that may be greater than or less than 1 to produce the data sample Ein. In such cases, the data sample Din of the digital signal 301 may be truncated and/or magnified or attenuated to produce the data sample Ein. In addition, a fixed offset value may be added to the value of the data sample Ein. The decomposing processor 304 decomposes the data sample Ein into a set of N data sub-samples E1-EN, in which the normalized range of the value of the data sample Ein is greater than the normalized range of the value of each of its data sub-samples E1-EN. The sum of the values of the set of data sub-samples E1-EN is equal to the value of the data sample Ein, i.e., $$E_{in} = \sum_{n=1}^{N} E_n. \quad (6)$$

The set of decomposed data sub-samples E1-EN may then be mapped one-to-one by the post-decomposing processor 305 to a set of N data sub-samples D1-DN, which become the actual inputs of a plurality of N D/A converters C1-CN, respectively, in accordance with the value of the data sample Ein.

For example, when the data sample Ein is divided by L to produce a quotient J, which is further divided by N to yield a quotient Y, as described above with reference to the operation of the data decomposer 202 (see FIG. 2), and Y is an even number, the mapping of E1-EN to D1-DN is one-to-one in the same order. But, when Y is an odd number, the mapping is one-to-one in the opposite order, i.e., E1 maps to the Nth data sub-sample of D1-DN, E2 maps to the (N−1)th data sub-sample of D1-DN, etc. In one embodiment, the mapping of E1-EN to D1-DN may be effectively random regardless of the value of the data sample Ein. The mapping functions described above can be performed in the post-decomposing processor 305 together with other functions. For example, the post-decomposing processor 305 may further adjust the value of each of the set of data sub-samples D1-DN individually (1) in accordance with a suitable model of the characteristics of its respective D/A converter C1-CN to compensate for the non-linear response of its respective D/A converter C1-CN, (2) by multiplying a value of a respective one of the set of data sub-samples D1-DN by a respective scaling factor, and/or (3) by adding a respective offset value to a value of a respective one of the set of data sub-samples D1-DN. It is noted that the resolution requirement for each of the plurality of D/A converters C1-CN (see FIG. 3) is reduced, however the sum of the values of the set of data sub-samples D1-DN may not be equal to the value of the data sample Din. It can be seen that the data decomposer 202 (see FIG. 2) is actually a special case of the data decomposer 302 (see FIG. 3).

While the operation of the data decomposers 202 and 302 (see FIGS. 2-3) is described herein according to their functionality, it should be understood that the data decomposers 202 and 302 can be embodied in whole or in part using hardware or software or some combination thereof using digital signal processors, micro-controllers, microprocessors, programmable logic array, or any other suitable hardware and/or software to produce the desired decomposed output.

It is possible to further improve the performance of the multi-channel D/A conversion system 200 or 300 (see FIGS. 2-3) by pre-processing the digital signal 201 or 301, respectively. For example, an interpolator and/or a noise shaper may be employed to pre-process the digital signal 201 or 301 before the digital signal 201 or 301 is provided to the data decomposer 202 or 302, respectively. In addition, a D/A conversion system, particularly a digital audio system, can be designed taking into account that a low frequency signal can be sampled at a lower rate than a high frequency signal to produce the same effective resolution. As a result, the low frequency band can employ fewer D/A converters or channels or loudspeakers than the high frequency band, while maintaining the same effective resolution in the respective frequency bands.

For example, a, band-separating filter may be employed to separate the digital signal into different frequency bands, and the separate frequency bands may then be processed in the same manner as described above.

It is noted that a high power switching type D/A converter such as a PWM or sigma-delta type D/A converter generally requires a very stable high output power supply. The presently disclosed multi-channel D/A conversion systems 200 and 300 including their multiple D/A converters C1-CN can avoid this requirement of providing a stable high output power supply by having each D/A converter employ a separate power supply, in which each power supply is based on the same reference voltage level as the other power supplies. As a result, a suitable number of smaller power supplies, each dedicated to one of the D/A converters C1-CN and effectively isolated from the other D/A converters C1-CN, can be employed to enable the D/A conversion system to produce a large system output without requiring a high output power supply.

In one embodiment, the multi-channel D/A conversion system 200 or 300 can be configured to produce a large system output by employing a high output switching type power supply to regulate its output voltage to be within a small range. This output voltage can then be fed to a number of linear voltage regulators, such that each linear voltage regulator provides power to a corresponding D/A converter. The output voltage of the switching type power supply is always slightly higher than the output voltage of the linear regulators so that the power dissipated in the linear regulators is minimal. This configuration provides the high efficiency of a switching type voltage regulator and the precision regulation of a linear voltage regulator. Moreover, the magnitude of the analog output of a switching type D/A conversion system can be controlled by varying the power supply voltage levels in concert. This can be accomplished, for example, by varying the reference voltage level that all of the voltage levels are based on.

It is understood that there are many different types of D/A converters for producing different kinds of analog outputs, and some of these D/A converters may include their own digital signal processing functions such as interpolating, filtering, noise shaping, dithering, etc. The following embodiments of digital audio systems are examples to illustrate the principle and operation of the presently disclosed multi-channel D/A conversion system.

Figure 4:
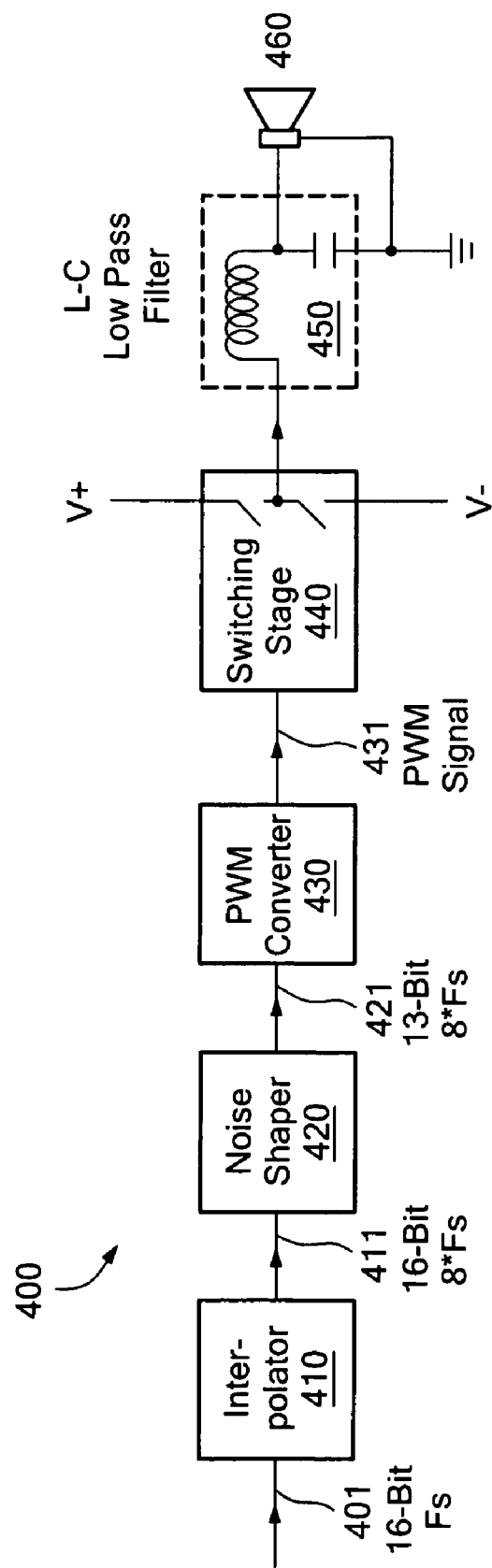
FIG. 4 is a schematic diagram showing the principal components of a typical PWM-based digital audio amplifier.

FIG. 4 depicts a conventional digital audio amplifier system 400 for direct processing of a digital signal. The digital audio amplifier system 400 includes an interpolator 410, a noise shaper 420, a PWM converter 430, a switching stage 440, a low-pass filter 450, and a loudspeaker 460. A 16-bit digital signal 401 is provided to the interpolator 410, which up-samples the 16-bit data 401 to a rate 8 times its original sampling rate Fs, i.e., 8*Fs, to produce 16-bit data 411. Next, the noise shaper 420 converts the 16-bit up-sampled data 411 to coarse-quantized data 421 with a reduced resolution of 13 bits at the same sampling rate of 8*Fs. It should be noted that the 13-bit data sample 421 at sampling rate 8*Fs has the same resolution as the original 16-bit data sample 401 at sampling rate Fs. Each 13-bit data sample 421 is provided to the PWM converter 430, which directly converts the data sample 421 into a PWM signal 431. The PWM signal 431 controls the switching stages 440 to provide a PWM electrical signal to the low-pass filter 450, and the filtered electrical signal is provided to the loudspeaker 460, which produces the desired audio output. The digital audio amplifier system 400 typically has a resolution problem, however, due to the limited switching speed of the power switching transistors in the switching stage 440.

Figure 5:
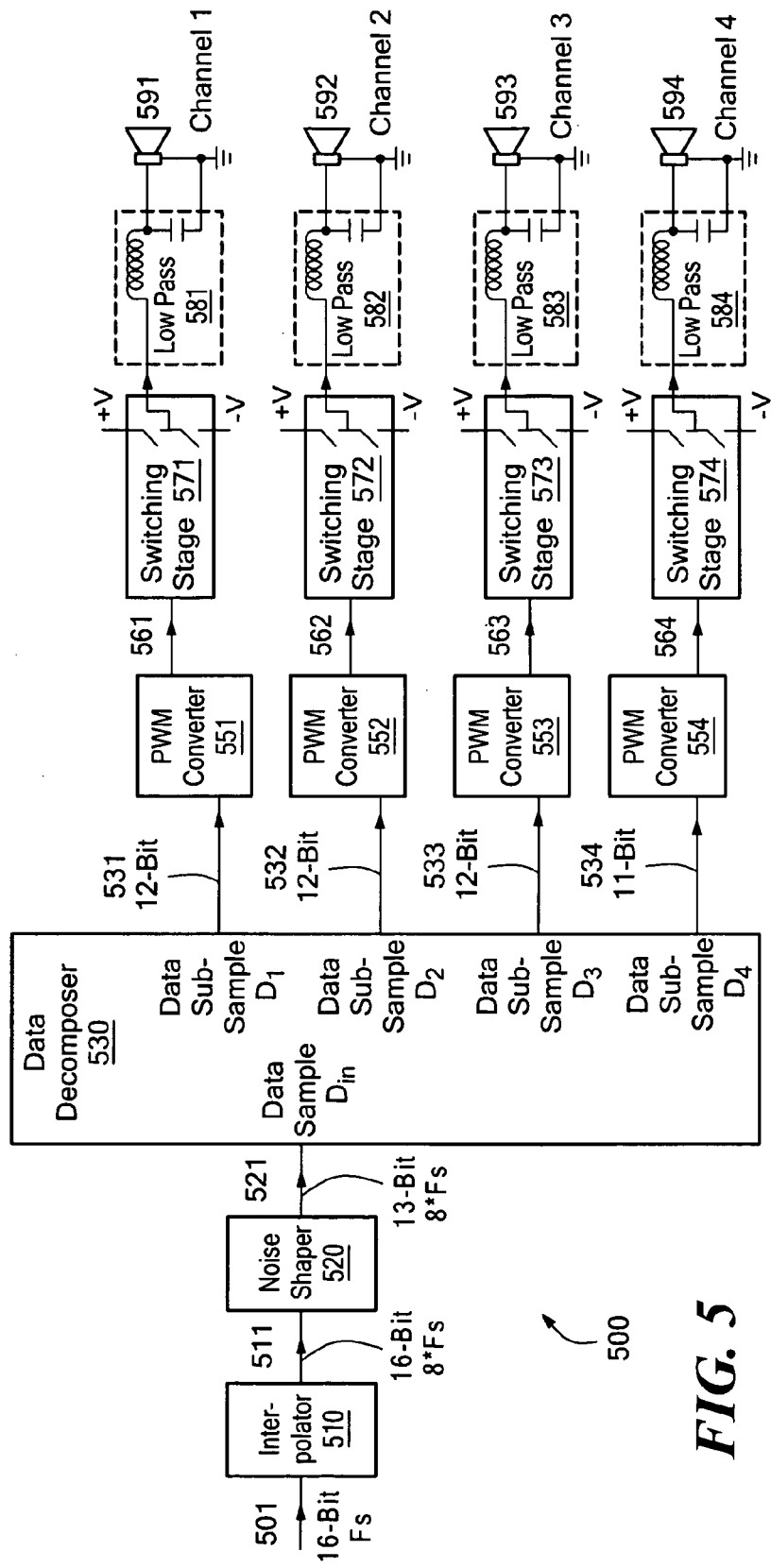
FIG. 5 is a schematic diagram of a digital audio system with four channels employing PWM converters to produce an audio output from a digital signal according to the present invention.

FIG. 5 depicts an illustrative embodiment of a digital audio system 500 employing multi-channel D/A conversion and PWM converters to produce an audio output from a digital signal, in accordance with the present invention. As shown in FIG. 5, the digital audio system 500 includes interpolator 510, a noise shaper 520, a data decomposer 530, and four D/A converters or channels 1-4. Specifically, channel 1 includes a PWM converter 551, a switching stage 571, a low-pass filter 581, and a loudspeaker 591; channel 2 includes a PWM converter 552, a switching stage 572, a low-pass filter 582, and a loudspeaker 592; channel 3 includes a PWM converter 553, a switching stage 573, a low-pass filter 583, and a loudspeaker 593; and, channel 4 includes a PWM converter 554, a switching stage 574, a low-pass filter 584, and a loudspeaker 594.

It is appreciated that a data sample of a digital audio signal can be in a signed or unsigned format. For clarity of discussion, the data sample of the digital signal 501 is assumed to be unsigned (signed data can be converted to unsigned data by adding an offset to it, and vice versa). A 16-bit digital signal 501 is provided to the interpolator 510, which up-samples the 16-bit data 501 to a rate 8 times its original sampling rate Fs, i.e., 8*Fs, to produce 16-bit data 511. Next, the noise shaper 520 converts the 16-bit up-sampled data 511 to coarse-quantized data 521 with a reduced resolution of 13 bits at the same sampling rate of 8*Fs. Each 13-bit data sample 521 is provided to a data decomposer 530 which decomposes the data sample 521 into data sub-samples D1 to D4 531-534. It should be noted that the 13-bit data sample 521 at sampling rate 8*Fs has the same resolution as the original 16-bit data sample 501 at sampling rate Fs. For clarity of discussion, the data decomposer 530 is configured like the data decomposer 202 of FIG. 2, with L=1 and N=4. Therefore, the data sub-samples 531-534 have as their values $Dn=Y$ if $Z<n-1$;

$Dn=Y$ if $Z=n-1$; or $Dn=Y+1$ if $Z>n-1$, (7)

in which "Y" is the quotient of the division of the 13-bit data 521 by 4; "Z" is the remainder of aforesaid division; and, Dn is a respective one of the data sub-samples 531-534 associated with channel n. In this case, Y is the most significant 11 bits of the 13-bit data 521, and each of the data sub-samples 531-534 differs in value only by at most 1. The PWM converters 551-554 then directly convert the data sub-samples 531-534 into PWM signals 561-564, respectively. If the value of the 13-bit data 521 is limited to a maximum value of $2^{13}-4$, then all of the data sub-samples 531-534 become 11-bit data, and the PWM converters 551-554 may have 11-bit resolution at the 8*FS sampling rate, i.e., ¼ of the resolution of the data sample 521. Alternatively, the data sample 521 may be attenuated slightly before decomposing into data sub-samples 531-534 so that each of the data sub-samples 531-534 can be 11-bits wide. In this way, the PWM converters 551-554 may also have 11-bit resolution at the 8*FS sampling rate, i.e., ¼ of the resolution of the data sample 521. The PWM signals 561-564 are provided to the switching stages 571-574, respectively, with the same resolution. Each output of the switching stages 571-574 swings between two voltage levels, for example, between equal magnitudes of a positive/negative voltage level, and is outputted to a respective low-pass filter 581-584. The filtered signals are then provided to respective loudspeakers 591-594.

The separate audio component signals from the loudspeakers 591-594 are combined additively in the transmission medium, e.g., the air, to produce substantially the same acoustic effect as the digital audio system 400 of FIG. 4. As described above, the digital audio system 400 comprises a single D/A converter or channel including the PWM converter 430, the switching stage 440, the low-pass filter 450, and the loudspeaker 460, and has the data sample 421 processed by the PWM converter 430 with 13-bit resolution at 8*Fs sampling rate to provide a PWM signal 431 to the switching stage 440 with the same resolution, the output of the switching stage 440 being provided to the low-pass filter 450 and the loudspeaker 460. However, the resolution requirement for each of the D/A converters or channels of the digital audio system 500 of FIG. 5 including the PWM converters 551-554, the switching stages 571-574, the low-pass filter 581-584, and the loudspeakers 591-594 is reduced to approximately ¼ of the resolution requirement for the corresponding single D/A converter of the digital audio system 400 (see FIG. 4). In other words, the switching speed requirement for the switching stages 571-574 of FIG. 5 can be reduced to approximately ¼ of the switching speed requirement for the corresponding switching stage 440 of the digital audio system 400 (see FIG. 4). Because the respective data sub-samples 531-534 differ in value by at most 1, smooth transitions in the outputs of the multiple channels of the digital audio system 500 and even distribution of power among the outputs of the multiple channels can be obtained in response to variations in the digital signal 501.

Figure 6:
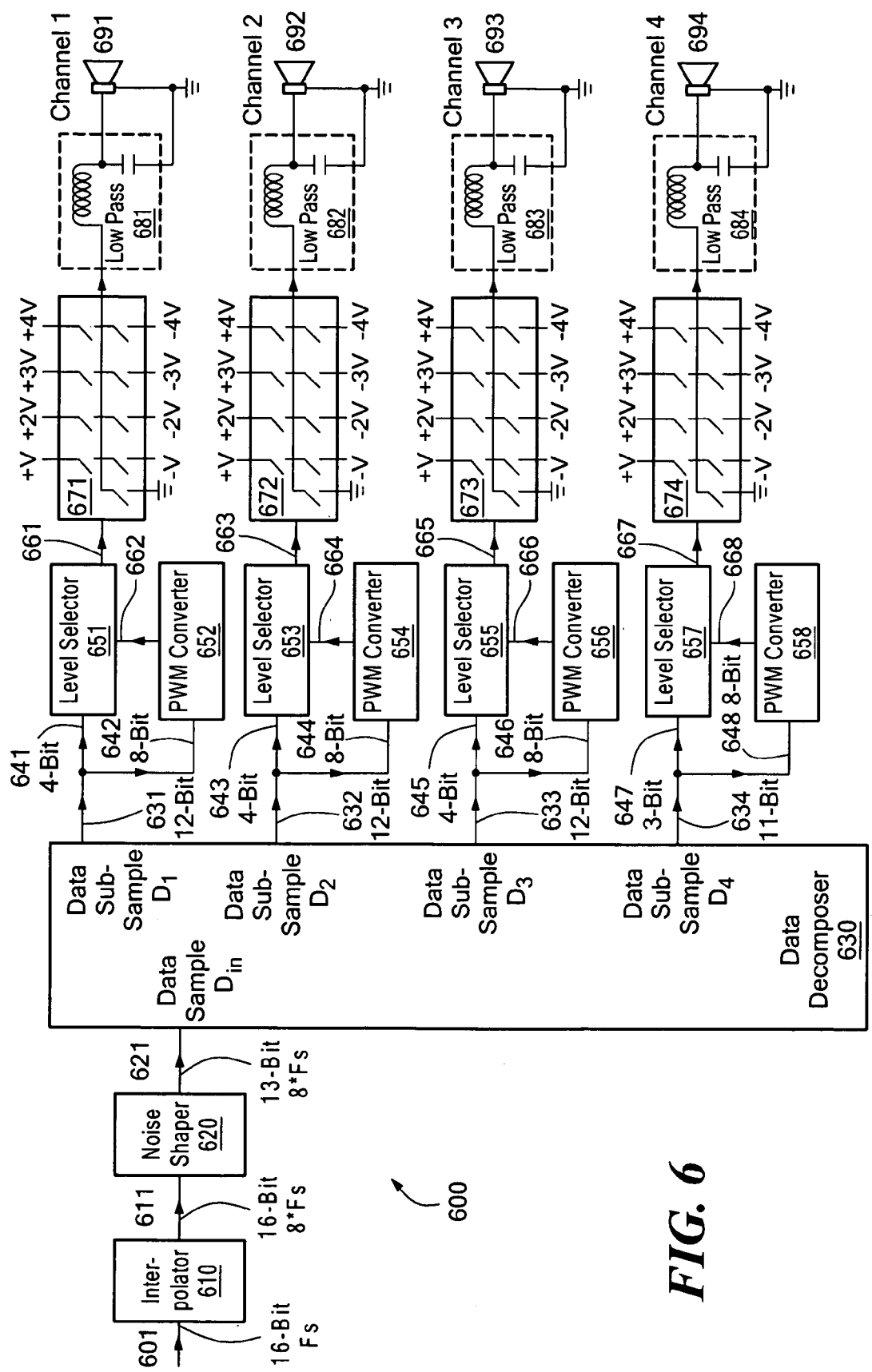
FIG. 6 is a schematic diagram of a digital audio system with four channels employing multi-level PWM converters to produce an audio output from a digital signal according to the present invention.

FIG. 6 depicts an illustrative embodiment of a digital audio system 600 employing multi-channel D/A conversion and multi-level PWM converters to produce an audio output from a digital signal according to the present invention. As shown in FIG. 6, the digital audio system 600 includes an interpolator 610, a noise shaper 620, a data decomposer 630, and four D/A converters or channels 1-4. Specifically, channel 1 includes a multi-level PWM converter comprising a level selector 651 and a PWM converter 652, a switching stage 671, a low-pass filter 681, and a loudspeaker 691; channel 2 includes a multi-level PWM converter comprising a level selector 653 and a PWM converter 654, a switching stage 672, a low-pass filter 682, and a loudspeaker 692; channel 3 includes a multi-level PWM converter comprising a level selector 655 and a PWM converter 656, a switching stage 673, a low-pass filter 683, and a loudspeaker 693; and, channel 4 includes a multi-level PWM converter comprising a level selector 657 and a PWM converter 658, a switching stage 674, a low-pass filter 684, and a loudspeaker 694. For clarity of discussion, the data sample of the digital signal 601 is assumed to be unsigned (signed data can be converted to unsigned data by adding an offset to it, and vice versa). A 16-bit digital signal 601 is provided to the interpolator 610, which up-samples the 16-bit data 601 to a rate 8 times its original sampling rate Fs, i.e., 8*Fs, to produce 16-bit data 611. Next, the noise shaper 620 converts the 16-bit up-sampled data 611 to coarse-quantized data 621 with a reduced resolution of 13 bits at the same sampling rate of 8*Fs. Each 13-bit data sample 621 is provided to a data decomposer 630, which decomposes the data sample 621 into data sub-samples D1 to D4 631-634. It should be noted that the 13-bit data sample 621 at the sampling rate 8*Fs has the same resolution as the original 16-bit data sample 601 at the sampling rate Fs. For clarity of discussion, the data decomposer 630 is configured like the data decomposer 202 of FIG. 2 with N=4. Specifically, the 13-bit data 621 is divided by L, in which L is obtained by adding 1 to the maximum value of the input data to the PWM converters 652, 654, 656, and 658, i.e., L=$2^8$. Dividing the 13-bit data 621 by $2^8$ yields a quotient J and a remainder K. In this illustrated embodiment, J is equal to the value of the most significant 5 bits of 621, and K is equal to the value of the least significant 8 bits of 621. Next, J is further divided by 4 to produce a quotient Y and a remainder Z. The output 631 of the data decomposer 630 for channel 1 is equal to $$Y*(2^8)+K \text{ if } Z=0; \text{ or}$$

$$(Y+1)*(2^8) \text{ if } Z>0. \tag{8}$$

The output 632 of the data decomposer 630 for channel 2 is equal to $$Y*(2^8) \text{ if } Z<1;$$

$$Y*(2^8)+K \text{ if } Z=1; \text{ or}$$

$$(Y+1)*(2^8) \text{ if } Z>1. \tag{9}$$

The output 633 of the data decomposer 630 for channel 3 is equal to $$Y*(2^8) \text{ if } Z<2;$$

$$Y*(2^8)+K \text{ if } Z=2; \text{ or}$$

$$(Y+1)*(2^8) \text{ if } Z>2. \tag{10}$$

Lastly, the output 634 of the data decomposer 630 for channel 4 is equal to $$Y*(2^8) \text{ if } Z<3; \text{ or}$$

$$Y*(2^8)+K \text{ if } Z=3. \tag{11}$$

The output 631 of the data decomposer 630 is split into two data sub-samples, i.e., one sub-sample 641 of Jv bits (e.g., Jv=4) containing the MSBs of the output 631 and one sub-sample 642 of Jw bits (e.g., Jw=8) containing the LSBs of the output 631. The 4-bit data sub-sample 641, which can have a value from 0 to 8, is provided to the level selector 651, while the 8-bit data sub-sample 642 is provided to the PWM converter 652, which directly converts the 8-bit data sub-sample 642 into a PWM signal 662.

In addition, the output 632 of the data decomposer 630 is split into two data sub-samples, i.e., one sub-sample 643 of Jv bits (e.g., Jv=4) containing the MSBs of the output 632 and one sub-sample 644 of Jw bits (e.g., Jw=8) containing the LSBs of the output 632. The 4-bit data sub-sample 643, which can have a value from 0 to 8, is provided to the level selector 653, while the 8-bit data sub-sample 644 is provided to the PWM converter 654, which directly converts the 8-bit data sub-sample 644 into a PWM signal 664.

In addition, the output 633 of the data decomposer 630 is split into two data sub-samples, i.e., one sub-sample 645 of Jv bits (e.g., Jv=4) containing the MSBs of the output 633 and one sub-sample 646 of Jw bits (e.g., Jw=8) containing the LSBs of the output 633. The 4-bit data sub-sample 645, which can have a value from 0 to 8, is provided to the level selector 655, while the 8-bit data sub-sample 646 is provided to the PWM converter 656, which directly converts the 8-bit data sub-sample 646 into a PWM signal 666.

In addition, the output 634 of the data decomposer 630 is split into two data sub-samples, i.e., one sub-sample 647 of 3 bits containing the MSBs of the output 634 and one sub-sample 648 of 8 bits containing the LSBs of the output 634. The 3-bit data sub-sample 647, which can have a value from 0 to 7, is provided to the level selector 657, while the 8-bit data sub-sample 648 is provided to the PWM converter 658, which directly converts the 8-bit data sub-sample 648 into a PWM signal 668.

During each sampling cycle of the data sub-samples 631-634, each one of the level selectors 651, 653, 655, and 657 generates respective control signals 661, 663, 665, and 667, to select among nine output voltage levels (e.g., 0, ±1V, ±2V, ±3V, and ±4V;) provided by the switching stages 671-674, respectively. It is noted that each cycle of an electrical signal provided by the respective switching stages 671-674 can have a variable-width portion having a voltage level (the "pulse level") that is one level higher than the level of the other portion of that cycle (the "base level") within a period Twmax, as determined by the respective outputs 662, 664, 666, and 668 of the PWM converters 652, 654, 656, and 658, respectively. Twmax is the maximum pulse width reference of the PWM signals 662, 664, 666, and 668. It should be noted that the maximum pulse width reference of a PWM signal representing a digital data sample with a fixed number of binary digits corresponds to the theoretical width of the PWM signal when the digital data sample is increased by 1 beyond its maximum value.

The selection of output voltage levels by the level selectors 651, 653, 655, and 657 is performed as follows. During the portion of each sampling cycle corresponding to the PWM signal 662, 664, 666, and 668, a pulse level is selected that is one level higher than the base level for the cycle, which is determined by the value of the respective data sub-sample 641, 643, 645, and 647 provided to the level selectors 651, 653, 655, and 657, respectively. Accordingly, if, for example, the base level is +2 volts, then the level +3 volts is selected during that portion of the cycle.

During the other portion of the cycle within Twmax, the level selectors 651, 653, 655, and 657 select the base level for that portion of the cycle. As described above, the base level is determined by the value of the data sub-sample 641, 643, 645, and 647, respectively. The condition for which the value of the respective data sub-sample 641, 643, 645, and 647 is zero corresponds to the base level being equal to the lowest voltage level (e.g., −4 volts), and successively greater values correspond to the base level being equal to successively higher voltages. This portion of the cycle lasts until the end of the maximum pulse duration Twmax. During the remaining portion of each sampling cycle extending beyond Twmax, the zero voltage level is selected. The zero voltage level may also be selected in the absence of the digital signal 601. Thus, each electrical output of the switching stages 671-674 is a multi-level PWM signal, which consists of a PWM component represented by the duration of the pulse level and a multi-level component represented by the magnitude of the base level. Each output of the switching stages 671-674 is provided to a respective low-pass filter 681-684, and the respective filtered signal is provided to a respective loudspeaker 691-694 to produce a respective audio component signal. The separate audio component signals from the loudspeakers 691-694 are combined additively in the transmission medium, e.g., the air, to produce the audio output of the digital audio system 600. As a result, smooth transitions in the outputs of the multiple channels of the digital audio system 600 and even distribution of power among the outputs of the multiple channels can be obtained in response to variations in the digital signal 601. It is noted that the required switching speed for the switching stages 671-674 can be effectively reduced to 1/32 of the required switching speed for the corresponding switching stage 440 of system 400 (see FIG. 4).

Figure 7:
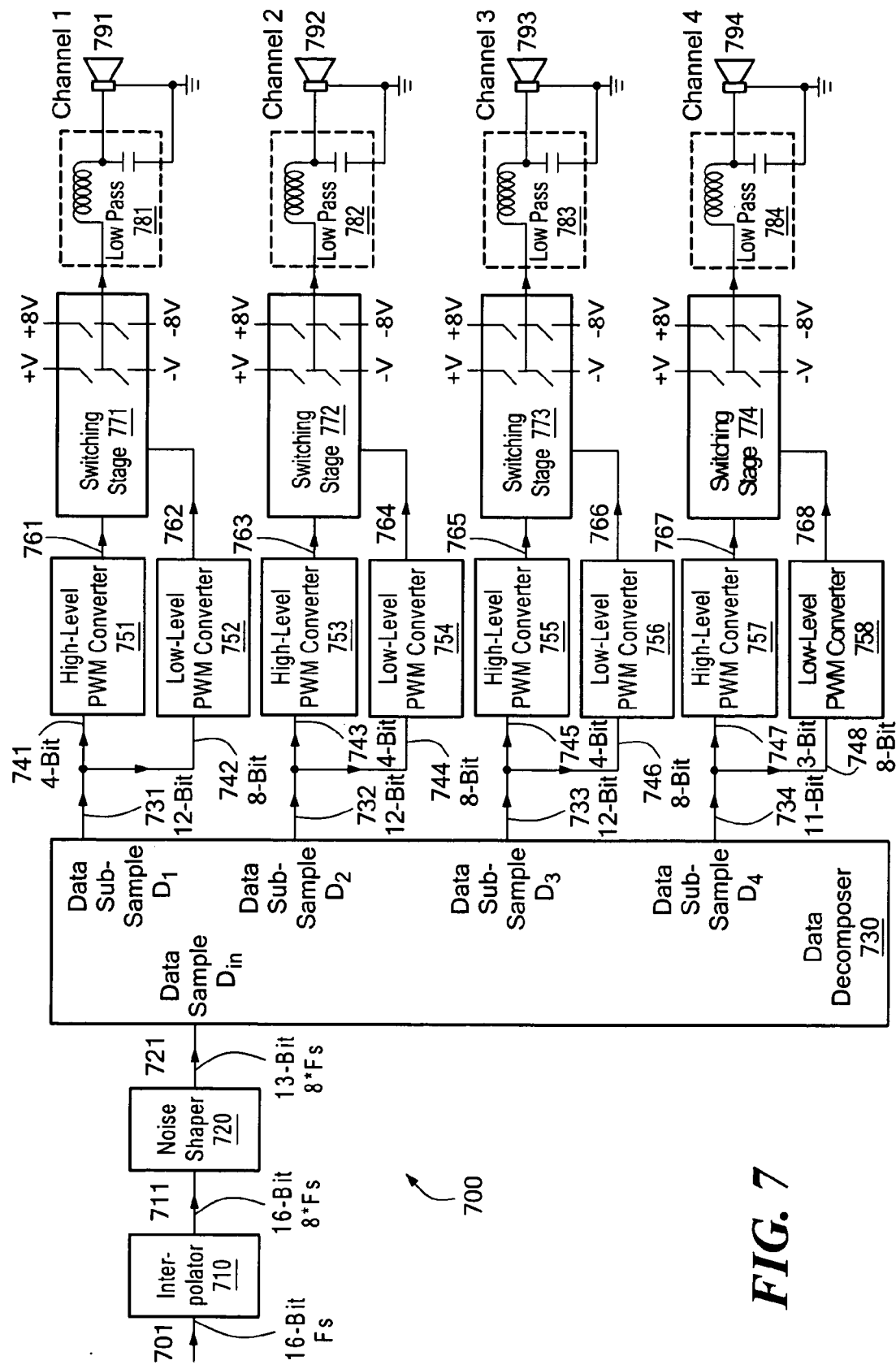
FIG. 7 is a schematic diagram of an alternative embodiment of the digital audio system of FIG. 6.

FIG. 7 depicts an alternative embodiment 700 of the digital audio system 600 of FIG. 6. Like the system 600, the digital audio system 700 employs multi-channel D/A conversion, but instead of employing a multi-level PWM converter for each channel, it employs two PWM converters for each channel. In the digital audio system 700 of FIG. 7, each sampling cycle of a digital signal is time divided into two portions. During one portion of a sampling cycle, a PWM signal representing a predetermined number of least significant Jw bits of a data sub-sample of the digital signal is used to control the output of the switching stage in a corresponding one of the channels. During the other portion of the sampling cycle, the output of the corresponding switching stage is controlled by a PWM signal having a pulse width that varies proportionately with the value of the most significant Jv bits of the data sub-sample of the digital signal, which has (Jv+Jw) bits. In one embodiment, the output of the switching stage in each channel swings between equal magnitudes of a first positive/negative voltage level during one portion of the sampling cycle, and swings between equal magnitudes of a second positive/negative voltage level during the other portion of the sampling cycle.

Because the PWM signal representing the least significant Jw bits of the data sub-sample of the digital signal in one portion of a sampling cycle normally produces an output at a lower voltage level than that produced by the PWM signal in the other portion of the sampling cycle, the PWM signal representing the least significant Jw bits of the data sub-sample of the digital signal is referred to herein as the low-level PWM signal, and its corresponding portion of the sampling cycle is referred to herein as the low-level portion. Further, the PWM signal in the other portion of the sampling cycle is referred to herein as the high-level PWM signal, and its corresponding portion of the sampling cycle is referred to herein as the high-level portion.

Moreover, because a respective switching stage 771-774 of a respective channel 1-4 (see FIG. 7) provides its output to a respective low-pass filter 781-784, which effectively sums the output of the respective switching stage during the two portions of the sampling cycle, the output of a respective one of the switching stages 771-774 corresponding to a low-level PWM signal corresponds to a PWM component of the output provided by a corresponding one of the switching stages 671-674 in the digital audio system 600 (see FIG. 6), and the output of a respective one of the switching stages 771-774 corresponding to a high-level PWM signal corresponds to a multi-level component of the output provided by a corresponding one of the switching stages 671-674 in the system 600. In the digital audio system 700 of FIG. 7, the high-level PWM signals operate at a level eight times higher than the low-level PWM signals.

As shown in FIG. 7, the digital audio system 700 includes an interpolator 710, a noise shaper 720, a data decomposer 730, and four D/A converters or channels 1-4. Specifically, channel 1 includes a high-level PWM converter 751, a low-level PWM converter 752, a switching stage 771, a low-pass filter 781, and a loudspeaker 791; channel 2 includes a high-level PWM converter 753, a low-level PWM converter 754, a switching stage 772, a low-pass filter 782, and a loudspeaker 792; channel 3 includes a high-level PWM converter 755, a low-level PWM converter 756, a switching stage 773, a low-pass filter 783, and a loudspeaker 793; and, channel 4 includes a high-level PWM converter 757, a low-level PWM converter 758, a switching stage 774, a low-pass filter 784, and a loudspeaker 794. Again, for clarity of discussion, the data sample of the digital signal 701 is assumed to be unsigned (signed data can be converted to unsigned data by adding an offset to it and vice versa). A 16-bit digital signal 701 is provided to the interpolator 710, which up-samples the 16-bit data 701 to a rate 8 times its original sampling rate Fs, i.e., 8*Fs, to produce 16-bit data 711. Next, the noise shaper 720 converts the 16-bit up-sampled data 711 to coarse-quantized data 721 with a reduced resolution of 13 bits at the same sampling rate of 8*Fs. Each 13-bit data sample 721 is provided to a data decomposer 730, which decomposes the data sample 721 into data sub-samples D1 to D4 731-734. It should be noted that the 13-bit data sample 721 at the sampling rate 8*Fs has the same resolution as the original 16-bit data sample 701 at the sampling rate Fs. For clarity of discussion, the data decomposer 730 is configured like the data decomposer 202 of FIG. 2 with N=4. Specifically, the 13-bit data 721 is divided by L, in which L is obtained by adding 1 to the maximum value of the input data to the low-level PWM converters 752, 754, 756, and 758, i.e., $L=2^8$. Dividing the 13-bit data 721 by $2^8$ yields a quotient J and a remainder K. In this illustrated embodiment, J is equal to the value of the most significant 5 bits of 721, and K is equal to the value of the least significant 8 bits of 721. Next, J is further divided by 4 to produce a quotient Y and a remainder Z. The output 731 of the data decomposer 730 for channel 1 is equal to $Y*(2^8)+K$ if Z=0; or $(Y+1)*(2^8)$ if Z>0. (12)

The output 732 of the data decomposer 730 for channel 2 is equal to $Y*(2^8)$ if Z<1;

$Y*(2^8)+K$ if Z=1; or $(Y+1)*(2^8)$ if Z>1. (13)

The output 733 of the data decomposer 730 for channel 3 is equal to $Y*(2^8)$ if Z<2;

$Y*(2^8)+K$ if Z=2; or $(Y+1)*(2^8)$ if Z>2. (14)

Lastly, the output 734 of the data decomposer 730 for channel 4 is equal to $Y*(2^8)$ if Z<3; or $Y*(2^8)+K$ if Z=3. (15)

The output 731 of the data decomposer 730 is split into two data sub-samples, i.e., one sub-sample 741 of Jv bits (e.g., Jv=4) containing the MSBs of the output 731 and one sub-sample 742 of Jw bits (e.g., Jw=8) containing the LSBs of the output 731. The 4-bit data sub-sample 741, which can have a value from 0 to 8, is provided to the high-level PWM converter 751, which directly converts the 4-bit data sub-sample 741 into a high-level PWM signal 761, while the 8-bit data sub-sample 742 is provided to the low-level PWM converter 752, which directly converts the 8-bit data sub-sample 742 into a low-level PWM signal 762.

In addition, the output 732 of the data decomposer 730 is split into two data sub-samples, i.e., one sub-sample 743 of Jv bits (e.g., Jv=4) containing the MSBs of the output 732 and one sub-sample 744 of Jw bits (e.g., Jw=8) containing the LSBs of the output 732. The 4-bit data sub-sample 743, which can have a value from 0 to 8, is provided to the high-level PWM converter 753, which directly converts the 4-bit data sub-sample 743 into a high-level PWM signal 763, while the 8-bit data sub-sample 744 is provided to the low-level PWM converter 754, which directly converts the 8-bit data sub-sample 744 into a low-level PWM signal 764.

In addition, the output 733 of the data decomposer 730 is split into two data sub-samples, i.e., one sub-sample 745 of Jv bits (e.g., Jv=4) containing the MSBs of the output 733 and one sub-sample 746 of Jw bits (e.g., Jw=8) containing the LSBs of the output 733. The 4-bit data sub-sample 745, which can have a value from 0 to 8, is provided to the high-level PWM converter 755, which directly converts the 4-bit data sub-sample 745 into a high-level PWM signal 765, while the 8-bit data sub-sample 746 is provided to the low-level PWM converter 756, which directly converts the 8-bit data sub-sample 746 into a low-level PWM signal 766.

In addition, the output 734 of the data decomposer 730 is split into two data sub-samples, i.e., one sub-sample 747 of 3 bits containing the MSBs of the output 734 and one sub-sample 748 of 8 bits containing the LSBs of the output 734. The 3-bit data sub-sample 747, which can have a value from 0 to 7, is provided to the high-level PWM converter 757, which directly converts the 3-bit data sub-sample 747 into a high-level PWM signal 767, while the 8-bit data sub-sample 748 is provided to the low-level PWM converter 758, which directly converts the 8-bit data sub-sample 748 into a low-level PWM signal 768.

As described above, each sampling cycle of the data sub-samples 731-734 is divided into two portions, specifically, the low-level portion handling the low-level PWM signals 762, 764, 766, and 768, while the high-level portion handling the high-level PWM signals 761, 763, 765, and 767. During the low-level portion of each sampling cycle, the low-level PWM converters 752, 754, 756, and 758 directly convert their input data 742, 744, 746, and 748 to low-level PWM signals 762, 764, 766, and 768, respectively, each having a maximum pulse width reference equal to Twmaxl. Next, during the high-level portion of each sampling cycle, the high-level PWM converters 751, 753, 755, and 757 generate high-level PWM signals 761, 763, 765, and 767, respectively, each having a pulse width proportional to the respective value of the input data 741, 743, 745, and 747. The condition for which the value of the input data 741, 743, 745, and 747 is zero corresponds to the zero pulse width of the PWM signals 761, 763, 765, and 767, respectively, and each successive increase in the value of the input data increases the pulse width by Twminh. Generally, Twmaxl multiplied by the magnitude of the low-level portion output voltage level should be equal to Twminh multiplied by the magnitude of the high-level portion output voltage level. In the illustrated embodiment, Twmaxl=8*Twminh. Because the maximum value of the input data 741, 743, 745, and 747 is equal to 8, the maximum pulse width Twmaxh for the high-level PWM signals 761, 763, 765, and 767 is also equal to 8*Twminh. Therefore, in the illustrated embodiment, Twmaxl is equal to Twmaxh.

The low-level PWM signals 762, 764, 766, and 768 control the switching stages 771-774, respectively, during the low-level portion of each sampling cycle such that their electrical outputs, e.g., across a designated load for a multiple H-bridge switch configuration, swing between equal magnitudes of a first positive/negative voltage level V (e.g., V=1 volt). Further, the high-level PWM signals 761, 763, 765, and 767 control the switching stages 771-774, respectively, during the high-level portion of each sampling cycle such that their electrical outputs, e.g., across a designated load for a multiple H-bridge switch configuration, swing between equal magnitudes of a second positive/negative voltage level P*V (e.g., P=8, V=1 volt). Each output of the switching stages 771-774 is provided to a respective low-pass filter 781-784, and the respective filtered signal is provided to a respective loudspeaker 791-794 to produce a respective audio component signal. The separate audio component signals from the speakers 791-794 are combined additively in the transmission medium, e.g., the air, to produce substantially the same acoustic effect as the digital audio system 600 (see FIG. 6).

Although the illustrative digital audio systems described above produce an audio output by additively combining a plurality of analog component outputs in the form of audio component signals acoustically generated by their respective loudspeakers, it is possible to produce an equivalent audio output by additively combining analog component outputs electromechanically or electrically using passive devices. For example, a digital audio system may include a multiple-voice-coil loudspeaker, and each channel of the system may drive a respective voice coil of the multiple-voice-coil loudspeaker instead of driving a separate loudspeaker. The multiple-voice-coil loudspeaker can then additively combine the respective analog component outputs of the channels electromechanically to produce the equivalent audio output. Alternatively, each channel of the digital audio system may drive the primary winding of a respective one of a plurality of audio transformers instead of driving a separate loudspeaker, in which each audio transformer includes a primary winding and a secondary winding. The plurality of audio transformers can then additively combine the respective analog component outputs of the channels electrically by having their secondary windings connected in series. As a result, the electrical outputs of the secondary windings of the audio transformers can be additively combined in phase, and provided to a loudspeaker to produce the equivalent audio output. It is noted that the number of loudspeakers, the number of voice coils in a multiple-voice-coil loudspeaker, or the number of audio transformers can be reduced by half if the two ends of a loudspeaker, a voice coil of a multiple-voice-coil loudspeaker, or a primary winding of an audio transformer are driven by the output stages of two channels in a bridge-tied load (BTL) configuration with the output of one channel being inverted, instead of having the output stage of each channel drive one loudspeaker, voice coil, or primary winding in a single-ended configuration.

Figure 8:
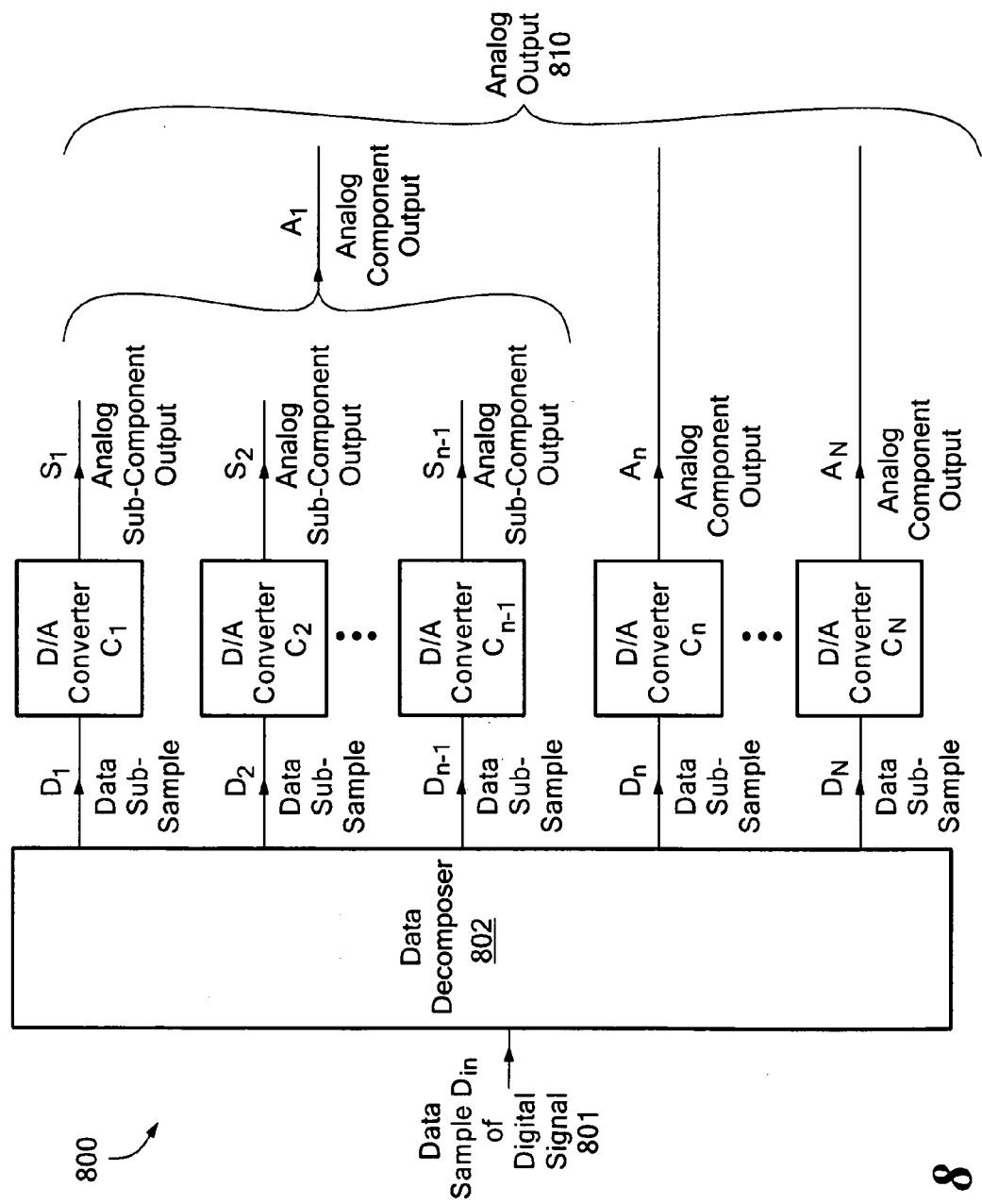
FIG. 8 is a block diagram of a multi-channel D/A conversion system for producing an analog output from a digital signal, in which a component of the analog output is generated by a plurality of D/A converters.

Furthermore, it is possible to produce an analog output by additively combining a plurality of analog component outputs generated by a plurality of D/A converters, in which each of the analog component outputs is generated by additively combining a set of analog sub-component outputs from a respective set of D/A converters. FIG. 8 depicts a multi-channel D/A conversion system 800 showing an analog component output A1 that is generated jointly by a set of D/A converters C1 to Cn−1 by additively combining a set of analog sub-component outputs S1 to Sn−1. As shown in FIG. 8, the data decomposer 802 decomposes a data sample Din of a digital signal 801 into a set of N data sub-samples D1-DN. The set of D/A converters C1 to Cn−1 converts a subset of data sub-samples D1 to Dn−1 into the set of analog sub-component outputs S1 to Sn−1. The analog component output A1 is generated by additively combining the set of analog sub-component outputs Si to Sn−1. The analog component output A1 is additively combined with other analog component outputs An-AN to produce the final analog output 810. It is noted that some of the other analog component outputs An-AN may also be generated jointly by some of the remaining D/A converters Cn-CN.

Figure 9:
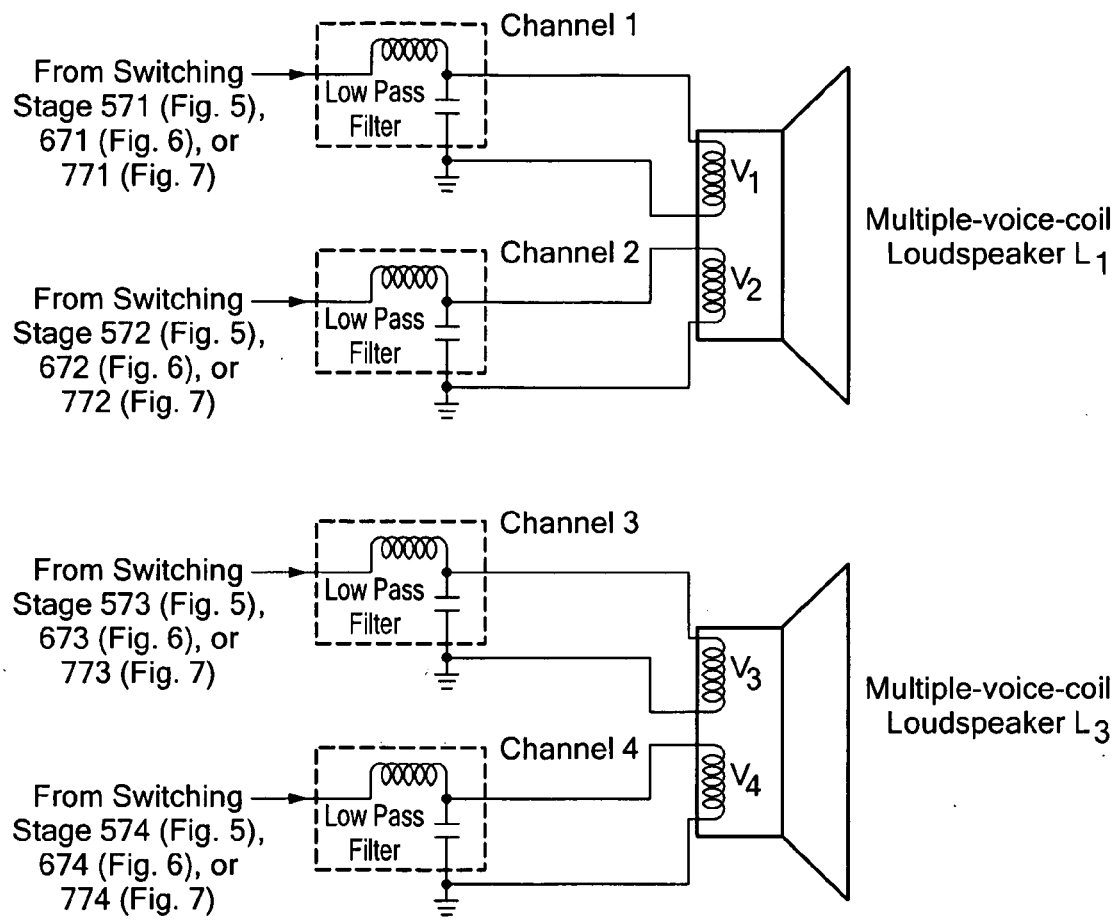
FIG. 9 is schematic diagram of an alternative embodiment of the digital audio system of FIG. 5, 6, or 7 including two multiple-voice-coil loudspeakers.

As shown in FIG. 9, an equivalent audio output of the digital audio system 500 (see FIG. 5), 600 (see FIG. 6), or 700 (see FIG. 7) can be produced by additively combining acoustically a plurality of analog component outputs (e.g., two) in the form of audio component signals generated by a plurality of multiple-voice-coil loudspeakers L1 and L3. Each multiple-voice-coil loudspeaker L1 and L3 includes a plurality of voice coils. For example, the multiple-voice-coil loudspeaker L1 includes two voice coils V1 and V2, and the multiple-voice-coil loudspeaker L3 includes two voice coils V3 and V4. Each channel of the digital audio system 500, 600, or 700 drives a respective voice coil (e.g., the voice coil V1, V2, V3, or V4) instead of driving a separate loudspeaker to generate one of a plurality of analog sub-component outputs associated with the multiple-voice-coil loudspeaker L1 or L3. The analog sub-component outputs are additively combined by the multiple-voice-coil loudspeakers L1 and L3 to generate a respective one of the plurality of analog component outputs.

Figure 10:
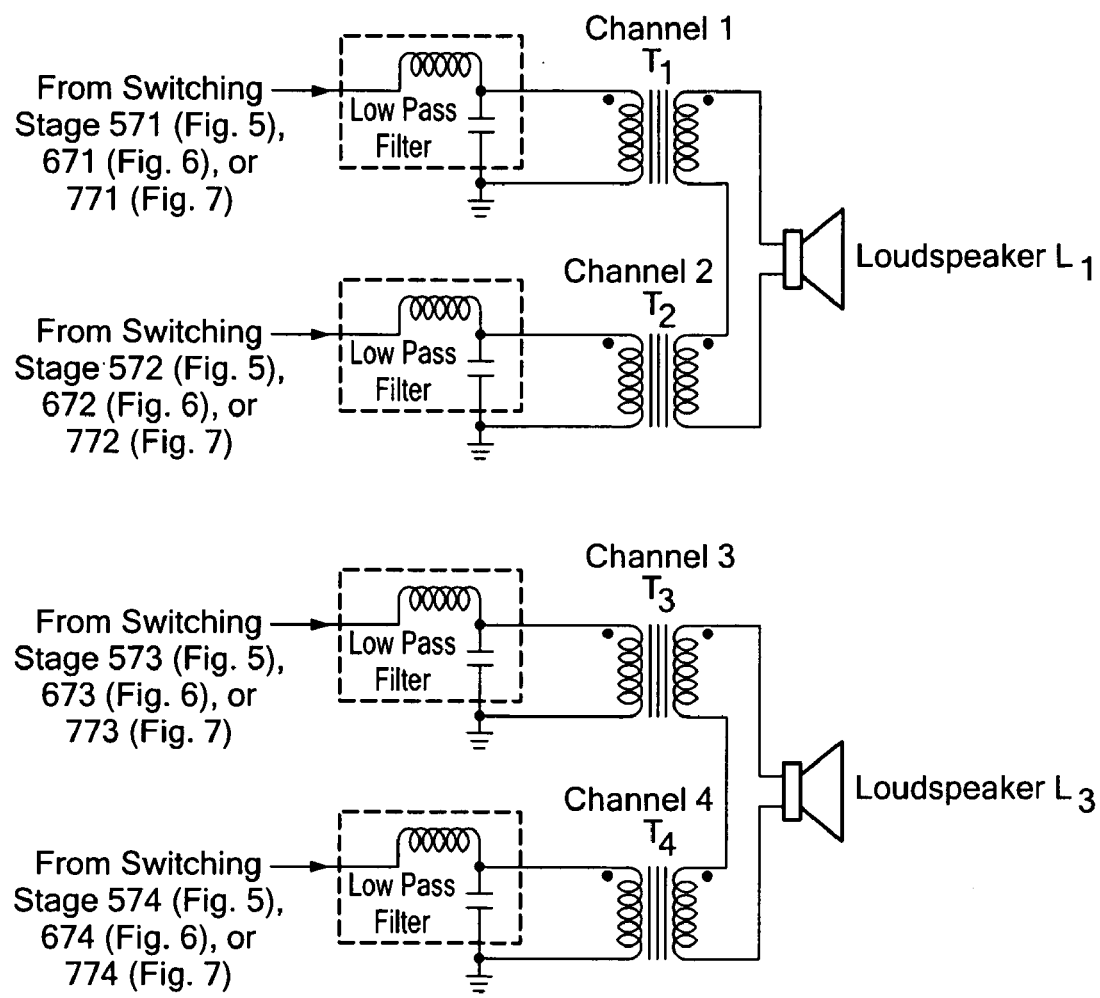
FIG. 10 is a schematic diagram of an alternative embodiment of the digital audio system of FIG. 5, 6, or 7 including four audio transformers and two loudspeakers.

Alternatively, as shown in FIG. 10, an equivalent audio output of the digital audio system 500 (see FIG. 5), 600 (see FIG. 6), or 700 (see FIG. 7) can be produced by additively combining acoustically a plurality of analog component outputs (e.g., two) in the form of audio component signals generated by a plurality of loudspeakers L1 and L3. The loudspeaker L1 is associated with a set of audio transformers T1 and T2, and the loudspeaker L3 is associated with a set of audio transformers T3 and T4. Each of the audio transformers T1-T4 includes of a primary winding and a secondary winding so that each channel of the digital audio system 500, 600, or 700 drives a respective primary winding instead of driving a separate loudspeaker. Each secondary winding of the audio transformers T1-T2 generates a respective one of a set of electrical outputs associated with the audio transformers T1 and T2, and each secondary winding of the audio transformers T3-T4 generates a respective one of a set of electrical outputs associated with the audio transformers T3 and T4. The secondary windings of the audio transformers T1 and T2 are connected in series, and the secondary windings of the audio transformers T3 and T4 are connected in series, so that their electrical outputs are additively combined in phase before being provided to the loudspeaker L1 or L3 associated therewith to generate a respective one of the plurality of analog component outputs.

It is appreciated that the above-described digital audio systems may employ any other suitable technique, or any suitable combination of techniques, of additively combining analog component outputs from different channels or sets of channels to produce an audio output. The techniques provided above are described herein for the purpose of illustrating the general principles of the present invention.

It will further be appreciated by those of ordinary skill in the art that modifications to and variations of the above-described multi-channel digital-to-analog (D/A) conversion system may be made without departing from the inventive concepts disclosed herein. Accordingly, the invention should not be viewed as limited except as by the scope and spirit of the appended claims.

What is claimed is:

1. A system for generating an analog output from a digital input signal at a sampling rate, the system comprising:
    a data decomposer operative to generate a set of first data sub-samples based on a first data sample of a first digital signal derived from the digital input signal,
    wherein a value of the first data sample has a corresponding normalized range,
    wherein a value of each first data sub-sample has a corresponding normalized range,
    wherein the normalized range of the value of the first data sample is greater than the normalized range of the value of each respective first data sub-sample, and
    wherein the data decomposer includes:
        a pre-decomposing processor operative to generate a second data sample based on the first data sample, a value of the second data sample having a corresponding normalized range;
        a data decomposing processor operative to generate a set of second data sub-samples based on the second data sample, a value of each second data sub-sample having a corresponding normalized range,
        wherein the normalized range of the value of the second data sample is greater than the normalized range of the value of each respective second data sub-sample, and
        wherein a sum of the values of the set of second data sub-samples is equal to the value of the second data sample; and
        a post-decomposing processor operative to generate the set of first data sub-samples based on the set of second data sub-samples; and
    a plurality of D/A converters, each D/A converter being associated with a respective one of the set of first data sub-samples, each D/A converter being operative to receive the respective first data sub-sample associated therewith, and to generate a respective one of a plurality of analog component outputs singly or jointly with at least one of the other D/A converters,
    whereby the analog output is produced by additively combining the plurality of analog component outputs.

2. The system of claim 1 wherein the first data sample has a corresponding minimum value, a corresponding maximum value, and a corresponding minimum incremental value,
    wherein the normalized range of the value of the first data sample is equal to a difference between the maximum value and the minimum value of the first data sample divided by the minimum incremental value of the first data sample,
    wherein each first data sub-sample has a corresponding minimum value, a corresponding maximum value, and a corresponding minimum incremental value, and
    wherein the normalized range of the value of each first data sub-sample is equal to a difference between the corresponding maximum value and the corresponding minimum value of the respective first data sub-sample divided by the corresponding minimum incremental value of the respective first data sub-sample.

3. The system of claim 1 wherein each of a subset of the set of first data sub-samples is associated with a respective one of the plurality of D/A converters,
    wherein each of the respective D/A converters is operative to receive the respective one of the subset of the set of first data sub-samples associated therewith, and to generate a respective one of a plurality of analog sub-component outputs associated with the subset of the set of first data sub-samples, and
    wherein the plurality of analog sub-component outputs associated with the subset of the set of first data sub-samples are additively combined to generate a respective one of the plurality of analog component outputs.

4. The system of claim 1 wherein a sum of the values of the set of first data sub-samples is equal to the value of the first data sample.

5. The system of claim 1 wherein the value of the second data sample is equal to one of (i) the value of the first data sample, and (ii) the value of the first data sample added to a predetermined offset value.

6. The system of claim 1 wherein the value of the second data sample is equal to one of (i) a value of a first predetermined number of most significant bits of the first data sample multiplied by a second predetermined number, and (ii) a value of a first predetermined number of most significant bits of the first data sample multiplied by a second predetermined number and added to a predetermined offset value.

7. The system of claim 1 wherein the value of each of the set of first data sub-samples is equal to one of (i) a value of a respective one of the set of second data sub-samples multiplied by a respective scaling factor, and (ii) a value of a respective one of the set of second data sub-samples multiplied by a respective scaling factor and added to a respective offset value.

8. The system of claim 1 wherein the post-decomposing processor is operative to map the set of second data sub-samples to the set of first data sub-samples based on the second data sample, and
    wherein each respective one of the set of first data sub-samples has a respective value equal to a value of a second data sub-sample mapped to the respective first data sub-sample and multiplied by a respective scaling factor.

9. The system of claim 1 wherein each respective one of the set of first data sub-samples has a respective value equal to a value generated by adjusting a value of a respective one of the set of second data sub-samples based on a model of characteristics of the respective D/A converter associated with the respective first data sub-sample to compensate for non-linearity of the respective D/A converter.

10. The system of claim 1 wherein the post-decomposing processor is operative to map the set of second data sub-samples to a set of third data sub-samples based on the second data sample, and
wherein each respective one of the set of first data sub-samples has a respective value equal to one of (i) a value generated by adjusting a value of a respective one of the set of third data sub-samples based on a model of characteristics of the respective D/A converter associated with the respective first data sub-sample to compensate for non-linearity of the respective D/A converter multiplied by a respective scaling factor, and (ii) a value generated by adjusting a value of a respective one of the set of third data sub-samples based on a model of characteristics of the respective D/A converter associated with the respective first data sub-sample to compensate for non-linearity of the respective D/A converter multiplied by a respective scaling factor and added to a respective offset value.

11. The system of claim 1 wherein each of the set of second data sub-samples differs in value from other second data sub-samples within the set of second data sub-samples by at most a predetermined absolute amount L, L being a positive number.

12. The system of claim 11 wherein the data decomposing processor is operative to divide the second data sample by L to yield a quotient J and a remainder K,
wherein the data decomposing processor is operative to divide J by N to yield a quotient Y and a remainder Z, N being a total number of second data sub-samples in the set of second data sub-samples, and
wherein an nth second data sub-sample in the set of second data sub-samples is equal to a value of Y*L if |Z|<n−1, a value of Y*L+K if |Z|=n−1, a value of [Y+1]*L if |Z|>n−1 and Z>0, or a value of [Y−1]*L if |Z|>n−1 and Z<0.

13. The system of claim 11 wherein the value of L is determined by the value of the second data sample.

14. The system of claim 12 wherein the post-decomposing processor is operative to map the set of second data sub-samples to the set of first data sub-samples in one order when Y is an even number and in a reverse order when Y is an odd number, and
wherein each respective one of the set of first data sub-samples has a respective value equal to a value of a second data sub-sample mapped to the respective first data sub-sample and multiplied by a respective scaling factor.

15. The system of claim 12 wherein the post-decomposing processor is operative to map the set of second data sub-samples to a set of third data sub-samples in one order when Y is an even number and in a reverse order when Y is an odd number, and
wherein each respective one of the set of first data sub-samples has a respective value equal to one of (i) a value generated by adjusting a value of a respective one of the set of third data sub-samples based on a model of characteristics of the respective D/A converter associated with the respective first data sub-sample to compensate for non-linearity of the respective D/A converters multiplied by a respective scaling factor, and (ii) a value generated by adjusting a value of a respective one of the set of third data sub-samples based on a model of characteristics of the respective D/A converter associated with the respective first data sub-sample to compensate for non-linearity of the respective D/A converters multiplied by a respective scaling factor and added to a respective offset value.

16. The system of claim 1 further comprising a noise shaper operative to generate the first digital signal which is coarsely quantized from the digital input signal.

17. The system of claim 1 wherein the digital input signal carries multi-bit values at a first sampling rate, and further comprising an interpolator operative to perform interpolation based on the digital input signal to obtain the first digital signal, the first digital signal carrying multi-bit values at a second sampling rate higher than the first sampling rate.

18. The system of claim 1 wherein the digital input signal carries multi-bit values at a first sampling rate, and further comprising:
an interpolator operative to perform interpolation based on the digital input signal to obtain a second digital signal, the second digital signal carrying multi-bit values at a second sampling rate higher than the first sampling rate; and
a noise shaper operative to generate the first digital signal which is coarsely quantized from the second digital signal.

19. The system of claim 1 wherein the analog output is a physical output.

20. The system of claim 19 wherein the physical output is selected from the group consisting of a liquid output, a gaseous output, a thermal output, an electrical output, an electromagnetic output, a mechanical output, and an acoustic output.

21. The system of claim 1 wherein the plurality of D/A converters is coupled to more than one power supply.

22. The system of claim 21 wherein each power supply coupled to a corresponding one of the plurality of D/A converters comprises:
at least one linear voltage regulator, each linear voltage regulator being operative to receive a corresponding coarsely regulated first voltage level from a switching voltage regulator, and to output a highly regulated second voltage level to the corresponding D/A converter,
wherein the coarsely regulated first voltage level is sufficiently higher than the second voltage level such that the linear voltage regulator can operate effectively with little power dissipated therein.

23. The system of claim 22 wherein the first and second voltage levels are based on a reference voltage level and can be varied in concert by varying the reference voltage level.

24. The system of claim 1 wherein the analog output is an audio output,
wherein each of the plurality of D/A converters is associated with a respective one of a plurality of channels, and
wherein each D/A converter comprises:
a PWM converter operative to generate a pulse width modulated signal corresponding to the channel associated therewith based on a respective one of the set of first data sub-samples;
a set of switches operative in response to an assertion of the pulse width modulated signal to provide a binary-level electrical signal corresponding to the channel associated therewith;
a low-pass filter operative to provide a low-pass filtered version of the binary-level electrical signal corresponding to the channel associated therewith; and
a mechanism operative to receive the low-pass filtered version of the binary-level electrical signal, and to generate a respective one of the plurality of analog component outputs singly or jointly with at least one of the other D/A converters.

25. The system of claim 24 wherein the mechanism is a loudspeaker operative to generate the respective analog component output corresponding to the channel associated therewith.

26. The system of claim 24 wherein the mechanism is one of a plurality of voice coils of a multiple-voice-coil loudspeaker operative to generate the respective analog component output corresponding to the channel associated therewith, and
wherein the plurality of analog component outputs are additively combined by the multiple-voice-coil loudspeaker to produce the audio output.

27. The system of claim 24 wherein the mechanism is one of a plurality of audio transformers operative to generate the respective analog component output corresponding to the channel associated therewith, each audio transformer comprising a respective primary winding and a respective secondary winding, and
wherein the plurality of analog component outputs are additively combined by having the secondary windings of the plurality of audio transformers connected in series so that the plurality of analog component outputs which are electrical outputs are additively combined in phase to be provided to a loudspeaker to produce the audio output.

28. The system of claim 24 wherein the mechanism is a respective one of a plurality of voice coils of a respective one of a plurality of multiple-voice-coil loudspeakers, the mechanism being operative to generate a respective one of a plurality of analog sub-component outputs corresponding to the channel associated therewith, the plurality of analog sub-component outputs being associated with the respective multiple-voice-coil loudspeaker,
wherein the plurality of analog sub-component outputs associated with the respective multiple-voice-coil loudspeaker are additively combined by the respective multiple-voice-coil loudspeaker to generate the respective analog component output.

29. The system of claim 24 wherein the mechanism is a respective one of a respective set of a plurality of sets of audio transformers,
wherein each of the respective set of audio transformers comprises of a respective primary winding and a respective secondary winding which generates a respective one of a set of electrical outputs corresponding to the channel associated therewith, the set of electrical outputs being associated with the respective set of audio transformers,
wherein the secondary windings of the respective set of audio transformers are connected in series so that the set of electrical outputs associated therewith are additively combined in phase to be provided to a respective one of a plurality of loudspeakers to generate the respective analog component output, each loudspeaker being associated with a respective set of the plurality of sets of audio transformers.

30. The system of claim 1 wherein the analog output is an audio output,
wherein each of the plurality of D/A converters is associated with a respective one of a plurality of channels, and
wherein each D/A converter comprises:
a PWM converter operative to generate a pulse width modulated signal corresponding to the channel associated therewith based on a predetermined number of least significant bits (LSBs) of a respective one of the set of first data sub-samples;
a level selector operative to assert each one of a set of control signals corresponding to the channel associated therewith in response to the pulse width modulated signal and a remaining number of most significant bits (MSBs) of the respective one of the set of first data sub-samples;
a set of switches operative to provide a multi-level electrical signal corresponding to the channel associated therewith, each switch in the set of switches being operative in response to an assertion of a respective one of the set of control signals;
a low-pass filter operative to provide a low-pass filtered version of the multi-level electrical signal corresponding to the channel associated therewith; and
a mechanism operative to receive the low-pass filtered version of the multi-level electrical signal, and to generate a respective one of the plurality of analog component outputs singly or jointly with at least one of the other D/A converters.

31. The system of claim 30 wherein the mechanism is a loudspeaker operative to generate the respective analog component output corresponding to the channel associated therewith.

32. The system of claim 30 wherein the mechanism is one of a plurality of voice coils of a multiple-voice-coil loudspeaker operative to generate the respective analog component output corresponding to the channel associated therewith, and
wherein the plurality of analog component outputs are additively combined by the multiple-voice-coil loudspeaker to produce the audio output.

33. The system of claim 30 wherein the mechanism is one of a plurality of audio transformers operative to generate the respective analog component output corresponding to the channel associated therewith, each audio transformer comprising a respective primary winding and a respective secondary winding, and
wherein the plurality of analog component outputs are additively combined by having the secondary windings of the plurality of audio transformers connected in series so that the plurality of analog component outputs which are electrical outputs are additively combined in phase to be provided to a loudspeaker to produce the audio output.

34. The system of claim 30 wherein the mechanism is a respective one of a plurality of voice coils of a respective one of a plurality of multiple-voice-coil loudspeakers, the mechanism being operative to generate a respective one of a plurality of analog sub-component outputs corresponding to the channel associated therewith, the plurality of analog sub-component outputs being associated with the respective multiple-voice-coil loudspeaker,
wherein the plurality of analog sub-component outputs associated with the respective multiple-voice-coil loudspeaker are additively combined by the respective multiple-voice-coil loudspeaker to generate the respective analog component output.

35. The system of claim 30 wherein the mechanism is a respective one of a respective set of a plurality of sets of audio transformers,
wherein each of the respective set of audio transformers comprises of a respective primary winding and a respective secondary winding which generates a respective one of a set of electrical outputs corresponding to the channel associated therewith, the set of electrical outputs being associated with the respective set of audio transformers, wherein the secondary windings of the respective set of audio transformers are connected in series so that the set of electrical outputs associated therewith are additively combined in phase to be provided to a respective one of a plurality of loudspeakers to generate the respective analog component output, each loudspeaker being associated with a respective set of the plurality of sets of audio transformers.

36. The system of claim 1 wherein the analog output is an audio output, wherein each of the plurality of D/A converters is associated with a respective one of a plurality of channels, and wherein each D/A converter comprises:

a low-level PWM converter operative to generate a low-level PWM signal corresponding to the channel associated therewith based on a predetermined number of least significant bits (LSBs) of a respective one of the set of first data sub-samples, wherein each sampling cycle of the first digital signal is time divided into a high-level portion and a low-level portion, and wherein the low-level PWM signal is within a duration of the low-level portion of a sampling cycle of the first digital signal;

a high-level PWM converter operative to generate a high-level PWM signal corresponding to the channel associated therewith based on a remaining number of most significant bits (MSBs) of the respective one of the set of first data sub-samples within a duration of the high-level portion of a sampling cycle of the first digital signal;

a switching stage operative in response to assertion of the high-level PWM signal and the low-level PWM signal to generate an electrical signal corresponding to the channel associated therewith;

a low-pass filter operative to provide a low-pass filtered version of the electrical signal corresponding to the channel associated therewith; and a mechanism operative to receive the low-pass filtered version of the electrical signal, and to generate a respective one of the plurality of analog component outputs singly or jointly with at least one of the other D/A converters.

37. The system of claim 36 wherein the mechanism is a loudspeaker operative to generate the respective analog component output corresponding to the channel associated therewith.

38. The system of claim 36 wherein the mechanism is one of a plurality of voice coils of a multiple-voice-coil loudspeaker operative to generate the respective analog component output corresponding to the channel associated therewith, and wherein the plurality of analog component outputs are additively combined by the multiple-voice-coil loudspeaker to produce the audio output.

39. The system of claim 36 wherein the mechanism is one of a plurality of audio transformers operative to generate the respective analog component output corresponding to the channel associated therewith, each audio transformer comprising a respective primary winding and a respective secondary winding, and wherein the plurality of analog component outputs are additively combined by having the secondary windings of the plurality of audio transformers connected in series so that the plurality of analog component outputs which are electrical outputs are additively combined in phase to be provided to a loudspeaker to produce the audio output.

40. The system of claim 36 wherein the mechanism is a respective one of a plurality of voice coils of a respective one of a plurality of multiple-voice-coil loudspeakers, the mechanism being operative to generate a respective one of a plurality of analog sub-component outputs corresponding to the channel associated therewith, the plurality of analog sub-component outputs being associated with the respective multiple-voice-coil loudspeaker, wherein the plurality of analog sub-component outputs associated with the respective multiple-voice-coil loudspeaker are additively combined by the respective multiple-voice-coil loudspeaker to generate the respective analog component output.

41. The system of claim 36 wherein the mechanism is a respective one of a respective set of a plurality of sets of audio transformers, wherein each of the respective set of audio transformers comprises of a respective primary winding and a respective secondary winding which generates a respective one of a set of electrical outputs corresponding to the channel associated therewith, the set of electrical outputs being associated with the respective set of audio transformers, wherein the secondary windings of the respective set of audio transformers are connected in series so that the set of electrical outputs associated therewith are additively combined in phase to be provided to a respective one of a plurality of loudspeakers to generate the respective analog component output, each loudspeaker being associated with a respective set of the plurality of sets of audio transformers.

42. A method of generating an analog output from a digital input signal at a sampling rate, the method comprising the steps of:

deriving a first digital signal from the digital input signal;

obtaining at least one first data sample of the first digital signal, wherein a value of the first data sample has a corresponding normalized range;

in a first generating step, generating a set of first data sub-samples based on the first data sample of the first digital signal, wherein a value of each first data sub-sample has a corresponding normalized range, wherein the normalized range of the value of the first data sample is greater than the normalized range of the value of each respective first data sub-sample, and wherein the first generating step includes:

generating a second data sample based on the first data sample, wherein a value of the second data sample has a corresponding normalized range;

generating a set of second data sub-samples based on the second data sample, wherein a value of each second data sub-sample has a corresponding normalized range, wherein the normalized range of the value of the second data sample is greater than the normalized range of the value of each respective second data sub-sample, and wherein a sum of the values of the set of second data sub-samples is equal to the value of the second data sample; and generating the set of first data sub-samples based on the set of second data sub-samples;

converting each of said set of first data sub-samples singly or jointly with at least one of the other first data sub-samples to a respective analog component output, thereby generating a plurality of analog component outputs; and additively combining the plurality of analog component outputs to produce the analog output.

43. The method of claim 42 wherein the first data sample has a corresponding minimum value, a corresponding maximum value, and a corresponding minimum incremental value, wherein the normalized range of the value of the first data sample is equal to a difference between the maximum value and the minimum value of the first data sample divided by the minimum incremental value of the first data sample, wherein each first data sub-sample has a corresponding minimum value, a corresponding maximum value, and a corresponding minimum incremental value, and wherein the normalized range of the value of each first data sub-sample is equal to a difference between the corresponding maximum value and the corresponding minimum value of the respective first data sub-sample divided by the corresponding minimum incremental value of the respective first data sub-sample.

44. The method of claim 42 wherein the set of first data sub-samples includes a subset of first data sub-samples, and wherein the converting step includes converting each of said subset of first data sub-samples to a respective analog sub-component output, thereby generating a plurality of analog sub-component outputs, and additively combining the plurality of analog sub-component outputs to generate a respective one of the plurality of analog component outputs.

45. The method of claim 42 including the step of generating the set of first data sub-samples based on the first data sample, wherein a sum of the values of the set of first data sub-samples is equal to the value of the first data sample.

46. The method of claim 42 including the step of generating the second data sample based on the first data sample, wherein the value of the second data sample is equal to one of (i) the value of the first data sample, and (ii) the value of the first data sample added to a predetermined offset value.

47. The method of claim 42 including the step of generating the second data sample based on the first data sample, wherein the value of the second data sample is equal to one of (i) a value of a first predetermined number of most significant bits of the first data sample multiplied by a second predetermined number, and (ii) a value of a first predetermined number of most significant bits of the first data sample multiplied by a second predetermined number and added to a predetermined offset value.

48. The method of claim 42 including the step of generating the set of first data sub-samples based on the set of second data sub-samples, wherein the value of each of the set of first data sub-samples is equal to one of (i) a value of a respective one of the set of second data sub-samples multiplied by a respective scaling factor, and (ii) a value of a respective one of the set of second data sub-samples multiplied by a respective scaling factor and added to a respective offset value.

49. The method of claim 42 including the step of mapping the set of second data sub-samples to the set of first data sub-samples based on the second data sample, wherein each respective one of the set of first data sub-samples has a respective value equal to a value of a second data sub-sample mapped to the respective first data sub-sample and multiplied by a respective scaling factor.

50. The method of claim 42 wherein the converting step includes converting each of said set of first data sub-samples to a respective one of the plurality of analog component outputs by a respective one of a plurality of D/A converters, each D/A converter being associated with a respective first data sub-sample, and wherein each respective one of the set of first data sub-samples has a respective value equal to a value generated by adjusting a value of a respective one of the set of second data sub-samples based on a model of characteristics of the respective D/A converter associated with the respective first data sub-sample to compensate for non-linearity of the respective D/A converter.

51. The method of claim 42 including the step of mapping the set of second data sub-samples to a set of third data sub-samples based on the second data sample, wherein the converting step includes converting each of said set of first data sub-samples to a respective one of the plurality of analog component outputs by a respective one of a plurality of D/A converters, each D/A converter being associated with a respective first data sub-sample, and wherein each respective one of the set of first data sub-samples has a respective value equal to one of (i) a value generated by adjusting a value of a respective one of the set of third data sub-samples based on a model of characteristics of the respective D/A converter associated with the respective first data sub-sample to compensate for non-linearity of the respective D/A converter multiplied by a respective scaling factor, and (ii) a value generated by adjusting a value of a respective one of the set of third data sub-samples based on a model of characteristics of the respective D/A converter associated with the respective first data sub-sample to compensate for non-linearity of the respective D/A converter multiplied by a respective scaling factor and added to a respective offset value.

52. The method of claim 42 including the step of generating the set of second data sub-samples based on the second data sample, wherein each of the set of second data sub-samples differs in value from other second data sub-samples within the set of second data sub-samples by at most a predetermined absolute amount L, L being a positive number.

53. The method of claim 52 including the steps of dividing the second data sample by L to yield a quotient J and a remainder K, and dividing J by N to yield a quotient Y and a remainder Z, N being a total number of second data sub-samples in the set of second data sub-samples, and wherein an nth second data sub-sample in the set of second data sub-samples is equal to a value of $Y*L$ if $|Z|<n-1$, a value of $Y*L+K$ if $|Z|=n-1$, a value of $[Y+1]*L$ if $|Z|>n-1$ and $Z>0$, or a value of $[Y-1]*L$ if $|Z|>n-1$ and $Z<0$.

54. The method of claim 52 wherein the value of L is determined by the value of the second data sample.

55. The method of claim 53 including the step of mapping the set of second data sub-samples to the set of first data sub-samples in one order when Y is an even number and in a reverse order when Y is an odd number, wherein each respective one of the set of first data sub-samples has a respective value equal to a value of a second data sub-sample mapped to the respective first data sub-sample and multiplied by a respective scaling factor.

56. The method of claim 53 including the step of mapping the set of second data sub-samples to a set of third data sub-samples in one order when Y is an even number and in a reverse order when Y is an odd number,
  wherein the converting step includes converting each of said set of first data sub-samples to a respective one of the plurality of analog component outputs by a respective one of a plurality of D/A converters, each D/A converter being associated with a respective first data sub-sample, and
  wherein each respective one of the set of first data sub-samples has a respective value equal to one of (i) a value generated by adjusting a value of a respective one of the set of third data sub-samples based on a model of characteristics of the respective D/A converter associated with the respective first data sub-sample to compensate for non-linearity of the respective D/A converters multiplied by a respective scaling factor, and (ii) a value generated by adjusting a value of a respective one of the set of third data sub-samples based on a model of characteristics of the respective D/A converter associated with the respective first data sub-sample to compensate for non-linearity of the respective D/A converters multiplied by a respective scaling factor and added to a respective offset value.

57. The method of claim 42 wherein the deriving step includes generating the first digital signal which is coarsely quantized from the digital input signal.

58. The method of claim 42 wherein the digital input signal carries multi-bit values at a first sampling rate, and including the step of performing interpolation based on the digital input signal to obtain the first digital signal, the first digital signal carrying multi-bit values at a second sampling rate higher than the first sampling rate.

59. The method of claim 42 wherein the digital input signal carries multi-bit values at a first sampling rate, and including the steps of performing interpolation based on the digital input signal to obtain a second digital signal, the second digital signal carrying multi-bit values at a second sampling rate higher than the first sampling rate, and wherein the deriving step includes generating the first digital signal which is coarsely quantized from the second digital signal.

60. The method of claim 42 including the step of additively combining the plurality of analog component outputs to produce the analog output, wherein the analog output is a physical output.

61. The method of claim 60 wherein the physical output is selected from the group consisting of a liquid output, a gaseous output, a thermal output, an electrical output, an electromagnetic output, a mechanical output, and an acoustic output.

62. The method of claim 42 wherein the analog output is an audio output,
  wherein the converting step includes converting each of said set of first data sub-samples to a respective one of the plurality of analog component outputs by a respective one of a plurality of D/A converters, each D/A converter being associated with a respective first data sub-sample, wherein each of the plurality of D/A converters is associated with a respective one of a plurality of channels, and
  including the steps of:
  in a second generating step, generating a pulse width modulated signal by a respective one of the plurality of D/A converters corresponding to the channel associated therewith based on a respective one of the set of first data sub-samples;
  in response to an assertion of the pulse width modulated signal, providing a binary-level electrical signal by a respective one of a plurality of sets of switches, wherein each of the plurality of sets of switches is associated with a respective one of the plurality of channels;
  providing a low-pass filtered version of the binary-level electrical signal by a respective one of a plurality of low-pass filters, wherein each of the plurality of low-pass filters is associated with a respective one of the plurality of channels;
  receiving the low-pass filtered version of the binary-level electrical signal by a respective one of a plurality of mechanisms, wherein each of the plurality of mechanisms is associated with a respective one of the plurality of channels; and
  in a third generating step, generating a respective one of the plurality of analog component outputs by the respective mechanism singly or jointly with at least one of the other D/A converters.

63. The method of claim 62 wherein each of the plurality of mechanisms is a loudspeaker.

64. The method of claim 62 wherein each of the plurality of mechanisms is one of a plurality of voice coils of a multiple-voice-coil loudspeaker, and
  wherein the combining step includes additively combining the plurality of analog component outputs by the multiple-voice-coil loudspeaker to produce the audio output.

65. The method of claim 62 wherein each of the plurality of mechanisms is one of a plurality of audio transformers, each audio transformer comprising a respective primary winding and a respective secondary winding, and
  wherein the combining step includes additively combining the plurality of analog component outputs by having the secondary windings of the plurality of audio transformers connected in series so that the plurality of analog component outputs which are electrical outputs are additively combined in phase, and providing the additively combined electrical outputs to a loudspeaker to produce the audio output.

66. The method of claim 62 wherein each of the plurality of mechanisms is a respective one of a plurality of voice coils of a respective one of a plurality of multiple-voice-coil loudspeakers, and
  wherein the third generating step includes generating a respective one of a plurality of analog sub-component outputs by a respective one of the mechanisms corresponding to the channel associated therewith, the plurality of analog sub-component outputs being associated with the respective multiple-voice-coil loudspeaker, and additively combining the plurality of analog sub-component outputs by the respective multiple-voice-coil loudspeaker associated therewith to generate the respective analog component output.

67. The method of claim 62 wherein each of the plurality of mechanisms is a respective one of a respective set of a plurality of sets of audio transformers,
  wherein each of the respective set of audio transformers comprises of a respective primary winding and a respective secondary winding which generates a respective one of a set of electrical outputs corresponding to the channel associated therewith, the set of electrical outputs being associated with the respective set of audio transformers,
  wherein the secondary windings of the respective set of audio transformers are connected in series, and wherein the third generating step includes additively combining in phase the set of electrical outputs associated with the secondary windings of the respective set of audio transformers connected in series, and providing the additively combined electrical outputs to a respective one of a plurality of loudspeakers to generate the respective analog component output, each loudspeaker being associated with a respective set of the plurality of sets of audio transformers.

68. The method of claim 42 wherein the analog output is an audio output,
wherein the converting step includes converting each of said set of first data sub-samples to a respective one of the plurality of analog component outputs by a respective one of a plurality of D/A converters, each D/A converter being associated with a respective first data sub-sample, wherein each of the plurality of D/A converters is associated with a respective one of a plurality of channels, and
including the steps of:
in a second generating step, generating a pulse width modulated signal by a respective one of the plurality of D/A converters corresponding to the channel associated therewith based on a predetermined number of least significant bits (LSBs) of a respective one of the set of first data sub-samples;
asserting each one of a set of control signals by the respective one of the plurality of D/A converters corresponding to the channel associated therewith in response to the pulse width modulated signal and a remaining number of most significant bits (MSBs) of the respective one of the set of first data sub-samples;
in response to an assertion of the set of control signals, providing a multi-level electrical signal by a respective one of a plurality of sets of switches, wherein each of the plurality of sets of switches is associated with a respective one of the plurality of channels;
providing a low-pass filtered version of the multi-level electrical signal by a respective one of a plurality of low-pass filters, wherein each of the plurality of low-pass filters is associated with a respective one of the plurality of channels;
receiving the low-pass filtered version of the multi-level electrical signal by a respective one of a plurality of mechanisms, wherein each of the plurality of mechanisms is associated with a respective one of the plurality of channels; and
in a third generating step, generating a respective one of the plurality of analog component outputs by the respective mechanism singly or jointly with at least one of the other D/A converters.

69. The method of claim 68 wherein each of the plurality of mechanisms is a loudspeaker.

70. The method of claim 68 wherein each of the plurality of mechanisms is one of a plurality of voice coils of a multiple-voice-coil loudspeaker, and
wherein the combining step includes additively combining the plurality of analog component outputs by the multiple-voice-coil loudspeaker to produce the audio output.

71. The method of claim 68 wherein each of the plurality of mechanisms is one of a plurality of audio transformers, each audio transformer comprising a respective primary winding and a respective secondary winding, and
wherein the combining step includes additively combining the plurality of analog component outputs by having the secondary windings of the plurality of audio transformers connected in series so that the plurality of analog component outputs which are electrical outputs are additively combined in phase, and providing the additively combined electrical outputs to a loudspeaker to produce the audio output.

72. The method of claim 68 wherein each of the plurality of mechanisms is a respective one of a plurality of voice coils of a respective one of a plurality of multiple-voice-coil loudspeakers, and
wherein the third generating step includes generating a respective one of a plurality of analog sub-component outputs by a respective one of the mechanisms corresponding to the channel associated therewith, the plurality of analog sub-component outputs being associated with the respective multiple-voice-coil loudspeaker, and additively combining the plurality of analog sub-component outputs by the respective multiple-voice-coil loudspeaker associated therewith to generate the respective analog component output.

73. The method of claim 68 wherein each of the plurality of mechanisms is a respective one of a respective set of a plurality of sets of audio transformers,
wherein each of the respective set of audio transformers comprises of a respective primary winding and a respective secondary winding which generates a respective one of a set of electrical outputs corresponding to the channel associated therewith, the set of electrical outputs being associated with the respective set of audio transformers,
wherein the secondary windings of the respective set of audio transformers are connected in series, and
wherein the third generating step includes additively combining in phase the set of electrical outputs associated with the secondary windings of the respective set of audio transformers connected in series, and providing the additively combined electrical outputs to a respective one of a plurality of loudspeakers to generate the respective analog component output, each loudspeaker being associated with a respective set of the plurality of sets of audio transformers.

74. The method of claim 42 wherein the analog output is an audio output,
wherein the converting step includes converting each of said set of first data sub-samples to a respective one of the plurality of analog component outputs by a respective one of a plurality of D/A converters, each D/A converter being associated with a respective first data sub-sample, wherein each of the plurality of D/A converters is associated with a respective one of a plurality of channels, and
including the steps of:
in a second generating step, generating a low-level PWM signal by a respective one of the plurality of D/A converters corresponding to the channel associated therewith based on a predetermined number of least significant bits (LSBs) of a respective one of the set of first data sub-samples,
wherein each sampling cycle of the first digital signal is time divided into a high-level portion and a low-level portion, and wherein the low-level PWM signal is within a duration of the low-level portion of a sampling cycle of the first digital signal;
in a third generating step, generating a high-level PWM signal by the respective one of the plurality of D/A converters corresponding to the channel associated therewith based on a remaining number of most significant bits (MSBs) of the respective one of the set of first data sub-samples within a duration of the high-level portion of a sampling cycle of the first digital signal;

in a fourth generating step, in response to an assertion of the high-level PWM signal and the low-level PWM signal, generating an electrical signal by a respective one of a plurality of switching stages, wherein each of the plurality of switching stages is associated with a respective one of the plurality of channels;

providing a low-pass filtered version of the electrical signal by a respective one of a plurality of low-pass filters, wherein each of the plurality of low-pass filters is associated with a respective one of the plurality of channels;

receiving the low-pass filtered version of the electrical signal by a respective one of a plurality of mechanisms, wherein each of the plurality of mechanisms is associated with a respective one of the plurality of channels; and in a fifth generating step, generating a respective one of the plurality of analog component outputs by the respective mechanism singly or jointly with at least one of the other D/A converters.

75. The method of claim 74 wherein each of the plurality of mechanisms is a loudspeaker.

76. The method of claim 74 wherein each of the plurality of mechanisms is one of a plurality of voice coils of a multiple-voice-coil loudspeaker, and wherein the combining step includes additively combining the plurality of analog component outputs by the multiple-voice-coil loudspeaker to produce the audio output.

77. The method of claim 74 wherein each of the plurality of mechanisms is one of a plurality of audio transformers, each audio transformer comprising a respective primary winding and a respective secondary winding, and wherein the combining step includes additively combining the plurality of analog component outputs by having the secondary windings of the plurality of audio transformers connected in series so that the plurality of analog component outputs which are electrical outputs are additively combined in phase, and providing the additively combined electrical outputs to a loudspeaker to produce the audio output.

78. The method of claim 74 wherein each of the plurality of mechanisms is a respective one of a plurality of voice coils of a respective one of a plurality of multiple-voice-coil loudspeakers, and wherein the fifth generating step includes generating a respective one of a plurality of analog sub-component outputs by a respective one of the mechanisms corresponding to the channel associated therewith, the plurality of analog sub-component outputs being associated with the respective multiple-voice-coil loudspeaker, and additively combining the plurality of analog sub-component outputs by the respective multiple-voice-coil loudspeaker associated therewith to generate the respective analog component output.

79. The method of claim 74 wherein each of the plurality of mechanisms is a respective one of a respective set of a plurality of sets of audio transformers, wherein each of the respective set of audio transformers comprises of a respective primary winding and a respective secondary winding which generates a respective one of a set of electrical outputs corresponding to the channel associated therewith, the set of electrical outputs being associated with the respective set of audio transformers, wherein the secondary windings of the respective set of audio transformers are connected in series, and wherein the fifth generating step includes additively combining in phase the set of electrical outputs associated with the secondary windings of the respective set of audio transformers connected in series, and providing the additively combined electrical outputs to a respective one of a plurality of loudspeakers to generate the respective analog component output, each loudspeaker being associated with a respective set of the plurality of sets of audio transformers.

80. The system of claim 1 wherein each D/A converter is operative to receive the respective first data sub-sample associated therewith, and to generate a respective one of a plurality of electrical outputs using a separate power supply electrically isolated from power supplies used for generating electrical outputs by the other D/A converters, and wherein the plurality of electrical outputs are additively combined in phase to produce the analog output by having the plurality of electrical outputs connected in series.

81. The method of claim 42 wherein the converting step includes converting each of said set of first data sub-samples to a respective one of a plurality of electrical outputs by a respective one of a plurality of D/A converters using a separate power supply electrically isolated from power supplies used for generating electrical outputs by the other D/A converters, each D/A converter being associated with a respective first data sub-sample, and wherein the plurality of electrical outputs are additively combined in phase to produce the analog output by having the electrical outputs connected in series.

* * * * *

UNITED STATES PATENT AND TRADEMARK OFFICE
CERTIFICATE OF CORRECTION

PATENT NO. : 7,317,413 B2  Page 1 of 1
APPLICATION NO. : 11/437289
DATED : January 8, 2008
INVENTOR(S) : Ying Lau Lee It is certified that error appears in the above-identified patent and that said Letters Patent is hereby corrected as shown below:

Column 22, line 26, "Si" should read --S1--.

Signed and Sealed this

First Day of September, 2009

David J. Kappos
*Director of the United States Patent and Trademark Office*